United States Patent [19]
Kusuyama et al.

[11] Patent Number: 6,058,781
[45] Date of Patent: May 9, 2000

[54] PRESSURE SENSOR STRUCTURE

[75] Inventors: Koichi Kusuyama; Masao Tsukada, both of Gunma, Japan

[73] Assignee: Unisia Jecs Corporation, Atsugi, Japan

[21] Appl. No.: 09/133,536

[22] Filed: Aug. 13, 1998

[30] Foreign Application Priority Data

Aug. 13, 1997 [JP] Japan ..................................... 9-231769
Apr. 14, 1998 [JP] Japan ................................... 10-120131

[51] Int. Cl.[7] ................................. G01L 9/08; G01L 9/12
[52] U.S. Cl. ............................... 73/724; 73/727; 257/419
[58] Field of Search ........................... 73/724, 726, 727; 338/42; 361/283.4; 257/419

[56] References Cited

U.S. PATENT DOCUMENTS

| | | | |
|---|---|---|---|
| 3,744,317 | 7/1973 | Hessinger | 73/726 |
| 4,287,501 | 9/1981 | Tominaga et al. | 338/42 |
| 4,314,226 | 2/1982 | Oguro et al. | 338/4 |
| 4,881,056 | 11/1989 | Mizukoshi et al. | 338/4 |
| 5,186,054 | 2/1993 | Sekimura | 73/724 |
| 5,493,470 | 2/1996 | Zavracky et al. | 361/283.4 |
| 5,683,594 | 11/1997 | Hocker et al. | 216/33 |

FOREIGN PATENT DOCUMENTS 2-132337  5/1990  Japan .

*Primary Examiner*—Joseph L. Felber
*Attorney, Agent, or Firm*—Foley & Lardner

[57] ABSTRACT

A pressure sensor including a substrate having a diaphragm portion. A diaphragm-defining recess is recessed inwardly from one surface of the substrate to define the diaphragm portion between a bottom surface of the recess and an opposite surface of the substrate. A recess is disposed within the diaphragm portion. A pressure sensitive arrangement is disposed in the substrate, a detector portion of which is disposed within the recess formed within the diaphragm portion.

46 Claims, 27 Drawing Sheets

PRESSURE SENSOR STRUCTURE

BACKGROUND OF THE INVENTION

The present invention relates to a pressure sensor and a method for forming the pressure sensor, and more specifically to a pressure sensor empolying a semiconductor substrate and a method for forming the same.

Generally, it is well known to fabricate a pressure sensor by, for example, etching a semiconductor substrate.

Japanese Patent Application First Publication No. 2-132337 discloses a pressure sensor employing a semiconductor substrate which has a diaphragm portion.

An example of such kinds of pressure sensors conventionally proposed includes a silicon substrate having opposed surfaces each lying substantially in a (100) crystal plane. The substrate has a recess recessed inwardly from one of the opposed surfaces to form a diaphragm portion having a reduced thickness. The recess is formed of a generally rectangular shape in section by anisotropic etching to form side walls lying substantially in a (111) crystal plane. A piezoresistive element is disposed on the diaphragm portion, which is capable of sensing strain caused in response to a pressure, for instance fluid pressure, exerted on the diaphragm portion.

In the conventionally proposed process for fabricating the pressure sensor, it is important to position the piezoresistive element and the diaphragm portion in a precise manner with respect to each other in order to correctly detect a value of the pressure acting on the diaphragm portion. For the alignment, masks for the piezoresistive element and the diaphragm portion are placed on the opposite sides of the silicon substrate in alignment with each other by using a suitable equipment such as a double sided aligner. It is known that the mask alignment on the opposite sides of the substrate is less accurate than the mask alignment carried out on one of the opposite sides thereof. This is because the masks tends to be placed in misaligned positions due to an offset of optical axes in the double sided aligner, for example, an infrared radiation aligner, a reflection-type aligner and the like.

If the opposite surfaces of the silicon substrate which are cut in the cutting process of the silicon substrate are out of the (100) crystal plane due to errors in slicing, abrasion or the like, in the cutting process, then the recess will be formed in a position displaced from a given position. Therefore, the diaphragm portion cannot be disposed in an intended position in the silicon substrate. In such case, even though the masks are precisely aligned with each other, it is likely that the diaphragm portion and the piezoresistive element are displaced from the alignment position.

A magnitude of the strain which is sensed by the piezoresistive element, varies depending on the position relative to the diaphragm portion. Therefore, the displacement of the diaphragm portion and the piezoresistive element from the alignment position influences the magnitude of the strain sensed by the piezoresistive element, making it difficult to detect the pressure acting on the diaphragm portion with high accuracy.

Meanwhile, if the diaphragm portion and the piezoresistive element each having a large size are used, dispersion of the sensed magnitude of strain which is caused by the misalignment of the diaphragm portion and the piezoresistive element, may be reduced and thus the accuracy of the pressure detection can increase. However, in this case, the pressure sensor cannot be reduced in size as the whole.

SUMMARY OF THE INVENTION

It is an object of the present invention to provide a pressure sensor including a diaphragm portion and a detector portion, such as piezoresistive element, of a pressure sensitive arrangement accurately aligned with each other, and capable of detecting a pressure applied thereto with an increased accuracy.

It is a further object of the present invention to provide a method of fabricating the pressure sensor having advantages as described above, which serves for reducing the dimension thereof.

It is a still further object of the present invention to provide a pressure sensor formed by the method described above.

According to one aspect of the present invention, there is provided a pressure sensor, comprising:

a diaphragm portion;

a substrate including said diaphragm portion, said substrate having one surface and an opposite surface and formed with a first recess recessed inwardly from said one surface to define said diaphragm portion between said first recess and said opposite surface;

a second recess disposed within the diaphragm portion; and a pressure sensitive arrangement having a detector portion disposed within the second recess.

According to further aspect of the present invention, there is provided a method for forming a pressure sensor, comprising the steps of:

a) preparing a substrate having opposed surfaces;

b) forming a first recess recessed inwardly from one of the opposed surfaces of the substrate to define a diaphragm portion between the first recess and the other of the opposed surfaces;

c) forming a second recess within the diaphragm portion; and d) placing a detector portion forming a part of a pressure sensitive arrangement, within the second recess.

According to still further aspect of the present invention, there is provided a pressure sensor formed by a method comprising the steps of:

a) preparing a substrate having opposed surfaces;

b) forming a first recess recessed inwardly from one of the opposed surfaces of the substrate to define a diaphragm portion between the first recess and the other of the opposed surfaces;

c) forming a second recess within the diaphragm portion; and d) placing a detector portion forming a part of a pressure sensitive arrangement, within the second recess.

DETAILED DESCRIPTION OF THE INVENTION

The present invention describes a novel new structure and technique for fabricating a pressure sensor employing a semiconductor substrate.

The detailed description of the pressure sensor structures and the processes for fabricating them has been simplified by using the following predetermined and named process sequence or definition that is repetitively referenced.

The term "deposited" refers to any method of layer formation that is suitable to the materials as are generally practiced throughout the semiconductor industry. One or more of the following examples of deposition techniques can be used with the materials, such as sputtering, chemical vapor deposition, electro or electroless plating, oxidation, evaporation, sublimation, plasma deposition, anodization, anodic deposition, molecular beam deposition or photodeposition.

Figure 1:
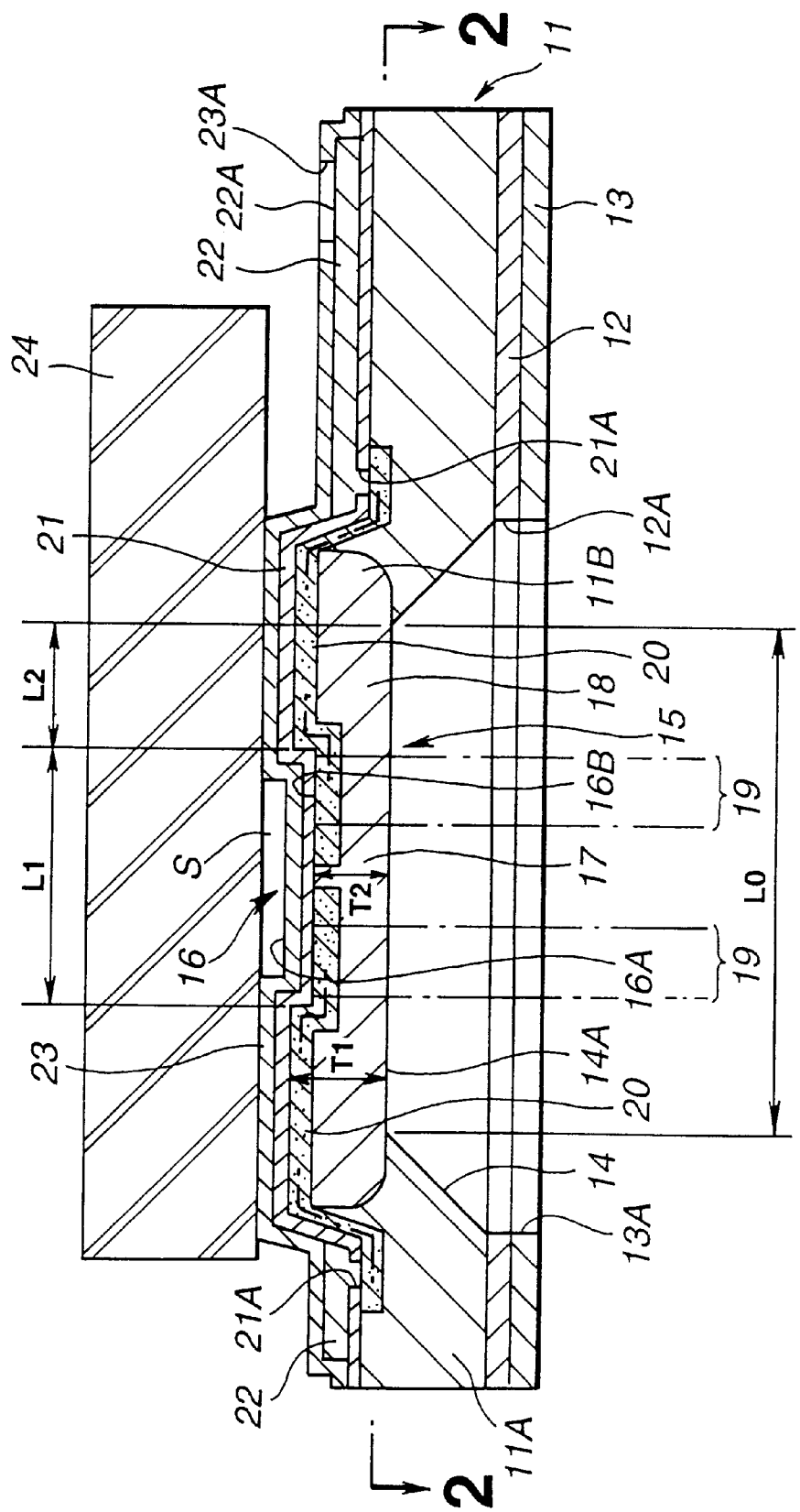
FIG. 1 is a cross-section of a pressure sensor of a first embodiment according to the present invention, taken along the line 1—1 of FIG. 2.
Figure 2:
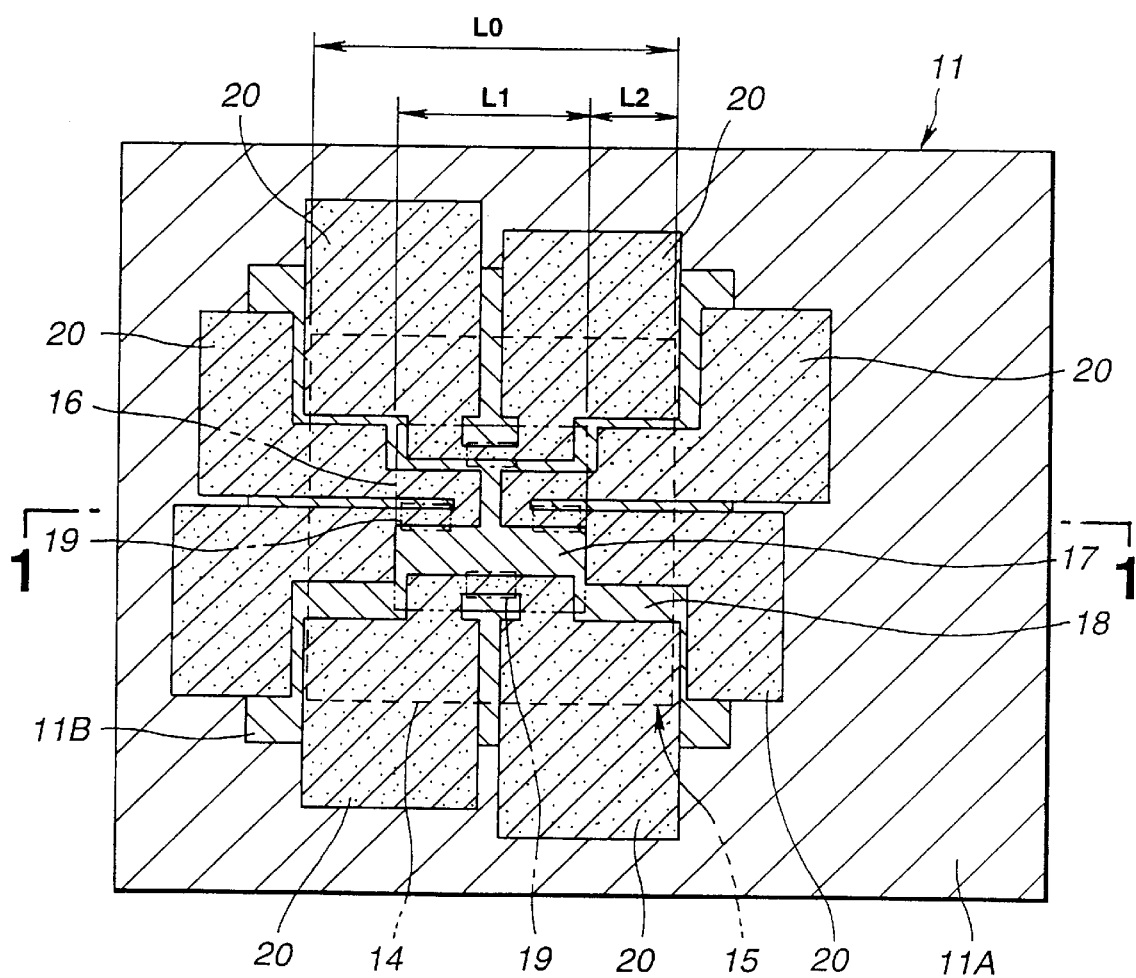
FIG. 2 is a cross-section of the pressure sensor, taken along the line 2—2 of FIG. 1.

Referring to FIGS. 1 and 2, a first preferred embodiment of a pressure sensor according to the present invention, will be explained hereinafter.

As illustrated in FIGS. 1 and 2, the pressure sensor includes a substrate 11. The substrate 11 is made of a single crystal silicon and has a generally rectangular shape in section as shown in FIG. 2. The substrate 11 includes a base 11A having a P-conductivity type, and a surface layer 11B having an N-conductivity type and grown onto the base 11A. The surface layer 11B is deposited on a central portion of an upper surface as viewed in FIG. 1, of the base 11A. A silicon dioxide film 12 is deposited on a lower surface as viewed in FIG. 1, of the base 11A which forms a lower surface of the substrate 11. A silicon nitride film 13 is deposited on the silicon dioxide film 12. The surface layer 11B has a thickness, for instance, of approximately 5–20 $\mu$m and forms a mesa portion of the substrate 11 raised outwardly, upwardly as viewed in FIG. 1, from the upper surface of the base 11A. An upper-side face of the surface layer 11B forms an upper surface of the substrate 11 in cooperation with the upper surface of the base 11A.

A diaphragm-defining recess 14 is formed in the substrate 11 to define a diaphragm portion 15 of the substrate 11 as explained later. The recess 14 also acts as a pressure port through which a pressure is applied to the pressure sensor. The recess 14 is recessed inwardly from the lower surface of the substrate 11 to define the diaphragm portion 15 between the recess 14 and the upper surface of the substrate 11. The recess 14 is disposed at substantially the center of the base 11A and has a planar bottom surface 14A of a generally rectangular shape as indicated by the broken line in FIG. 2. The generally rectangular shape of the bottom surface 14A is formed by line segments each having a predetermined length L0, for example, of approximately 150 $\mu$m. The recess 14 extends through the base 11A to be opposed to a rearside face of the surface layer 11B. The recess 14 is formed by a suitable conventional etching technique such as wet etching, through apertures 12A and 13A respectively formed in the silicon dioxide film 12 and the silicon nitride film 13.

The diaphragm portion 15 is disposed in the surface layer 11B. As illustrated in FIG. 2, the diaphragm portion 15 is defined by the rectangular-shaped planar bottom surface 14A of the recess 14. The diaphragm portion 15 has a width coincident with the predetermined length L0 of the line segments of the rectangular shaped bottom surface 14A of the recess 14. The diaphragm portion 15 has a predetermined thickness T1 as shown in FIG. 1.

Disposed within the diaphragm portion 15 is a recess 16 where the pressure applied to the diaphragm portion 15 is detected. The recess 16 is recessed inwardly from an upperside face of the surface layer 11B to define a thinned portion 17 of the diaphragm portion 15 between a planar bottom surface of the recess 16 and the planar bottom surface 14A of the recess 14. The diaphragm portion 15 also has a thicker portion 18 surrounding the thinned portion 17 and the recess 16.

The recess 16 has a generally rectangular shallow groove-like shape formed by dry etching as explained later. The recess 16 is defined by a recessed surface 16B formed in the surface layer 11B where the diaphragm portion 15 is disposed. The recessed surface 16B includes the planar bottom surface of a generally rectangular shape. The rectangular-shaped bottom surface of the recessed surface 16B is defined by four line segments each having a predetermined length L1, for example of approximately 100 μm. The bottom surface of the recessed surface 16B of the recess 16 has a smaller area than that of the bottom surface 14A of the recess 14.

The thinned portion 17 of the diaphragm portion 15 has a width coincident with the predetermined length L1 of the line segments of the rectangular-shaped bottom surface of the recess 16, and a predetermined thickness T2 extending between the rearside face of the surface layer 11B and the bottom surface of the recess 16. The thinned portion 17 is flexible in response to a pressure applied to the diaphragm portion 15. The thicker portion 18 extends along a rectangular periphery of the thinned portion 17 and has a generally rectangular frame-like shape as shown in FIG. 2. The thicker portion 18 has a predetermined width L2 of not less than 10 μm, for instance, of approximately 25 μm. The thicker portion 18 has a predetermined thickness coincident with the thickness T1 of the diaphragm portion 15 and greater than the thickness T2 of the thinned portion 17.

Disposed within the recess 16 is a detector portion 19 of a pressure sensitive arrangement which detects flexure generated in the thinned portion 17 of the diaphragm portion 15. The detector portion 19 may be a piezoresistive element, a piezoelectric element or the like. In this embodiment, a plurality of piezoresistive elements 19, for instance four, are placed inside along the periphery of the bottom surface of the recess 16, namely, the periphery of the thinned portion 17. As illustrated in FIG. 2, the four piezoresistive elements 19 are of an elongated rectangular shape and positioned at the front, rear, left and right sides of the thinned portion 17 in spaced relation to each other. Each of the piezoresistive elements 19 is of a P-conductivity type formed by doping impurity such as boron into the surface layer 11B of the substrate 11, using ion implantation. The piezoresistive element 19 is strainable in response to the flexure of the thinned portion 17 to detect the flexure as the pressure applied to the diaphragm portion 15.

Diffused leads 20 are disposed on predetermined portions of the substrate 11 as shown in FIG. 2. The diffused leads 20 are formed by doping impurity into portions of the surface layer 11B, for instance, by using ion implantation as well as the piezoresistive elements 19. Each of the diffused leads 20 has one end portion disposed within the recess 16 of the diaphragm portion 15 and an opposite end portion extending outside the recess 16. The one end portion of the diffused lead 20 is connected with each piezoresistive element 19 and the opposite end portion thereof is connected with an electrically conductive film 22 as explained later. The diffused lead 20 has a conductivity higher than that of the piezoresistive element 19.

An insulator film 21 of an electrically insulating material, for instance silicon dioxide, is deposited on the upper surface of the substrate 11. The insulator film 21 is conformally deposited on the recess 16 to cover the piezoresistive elements 19 and the diffused leads 20. The insulator film 21 also covers the upper-side face of the surface layer 11B around the recess 16 and the upper surface of the base 11A connected with the upper-side face thereof via an inclined surface therebetween. The insulator film 21 has a thickness of approximately 0.3–0.9 μm. The insulator film 21 has contact holes 21A each positioned on the opposite end portion of the diffused lead 20. The diffused leads 20 are connected with the electrically conductive films 22 selectively deposited over the upper surface of the base 11A, through the contact holes 21A.

Each of the electrically conductive films 22 may be made of metals such as aluminum. The electrically conductive film 22 has one end portion connected with the diffused lead 20 through the contact hole 21A of the insulator film 21. The electrically conductive film 22 has the other end outside the diaphragm portion 15 which forms an electrode 22A connected to an external detecting circuit, not shown.

With this pressure sensitive arrangement, an output signal indicative of the pressure detected by each piezoresistive element 19 is introduced into the external detecting circuit.

A protective film 23 of an electrically insulating material is deposited overall the upper surface of the substrate 11. The protective film 23 covers the electrically conductive films 22 and the diaphragm portion 15 of the surface layer 11B which is covered with the insulator film 21. The protective film 23 has contact holes 23A for electrical connection of the electrically conductive films 22 with the external detecting circuit, each being located corresponding to the electrode 22A of the electrically conductive film 22. FIG. 1 shows one of the electrodes 22A and the corresponding contact hole 23A, for simple illustration.

The insulator film 21 and the protective film 23 are extremely thinned and conformally deposited on the recess 16. Thus, an outer, upper as viewed in FIG. 1, recessed surface 16A is formed atop the protective film 23. The outer recessed surface 16A is similar in shape to the recessed surface 16B.

A lid 24 is fixed to the thicker portion 18 of the diaphragm portion 15 of the substrate 11 via the insulator film 21 and the protective film 23, covering the recess 16 and the detector portion 19 within the recess 16. The lid 24 is made of a suitable material having a predetermined rigidity to reinforce the thicker portion 18. The lid 24 increases mechanical strength of the thicker portion 18 to prevent the thicker portion 18 from being flexed when the diaphragm portion 15 is subject to a pressure within the recess 14. The lid 24 may be made of PYREX glass and be secured, by anode coupling, to the thicker portion 18. The lid 24 cooperates with the diaphragm portion 15 to define a reference pressure chamber S between the outer recessed surface 16A of the recess 16 and a surface of the lid 24 which is opposed to the recess 16. When a pressure is applied to the diaphragm portion 15 via the recess 14 as the pressure port, the thinned portion 17 of the diaphragm portion 15 is flexibly deformable by a differential pressure between the reference pressure chamber S and the recess 14.

It will be appreciated from the above description that, with the arrangement of the diaphragm portion 15 and the recess 16 within the diaphragm portion 15, the thinned portion 17 of the diaphragm portion 15 which is defined by the recess 16 can be more flexible than the thicker portion 18 thereof in response to application of a pressure to the diaphragm portion 15.

With the arrangement of the lid 24 covering the recess 16, the thicker portion 18 of the diaphragm portion 15 which is disposed around the recess 16 can be reinforced by the lid 24. Therefore, when a pressure is applied to the diaphragm portion 15, the thicker portion 18 can be prevented from being easily flexed while the thinned portion 17 defined by the recess 16 is more flexibly deformable. The detector portion 19 disposed within the recess 16 at the thinned portion 17 can detect the pressure applied to the diaphragm portion 15.

Further, since the diaphragm-defining recess 14 has the bottom surface 14A greater in area than the bottom surface 16B, a part of the inner recessed surface 16B, of the recess 16, the recess 16 can be readily placed within the diaphragm portion 15 defined by the bottom surface 14A of the recess 14. Therefore, the detector portion 19 of the pressure sensitive arrangement which is disposed within the recess 16 can be certainly subject to flexure generated in the thinned portion 17 by a pressure applied to the diaphragm portion 15. This serves for reducing the adverse influence on detection accuracy of the pressure sensor which is caused in a case where the recess 16 is placed outside the diaphragm portion 15.

Furthermore, the thicker portion 18 of the diaphragm portion 15 which has the width not less than 10 μm, can permit the position of the bottom surface 14A of the recess 14 to be offset by approximately 10 μm from the intended position relative to the recess 16, even though the cut surface of the substrate 11 is out of the (100) crystal plane due to errors in the cutting process of the substrate 11.

The thinned portion 17 of the diaphragm portion 15 which is defined by the recess 16, acts as an easily flexible part of the diaphragm portion 15. The thinned portion 17 and the detector portion 19 located at the thinned portion 17 can be positioned in alignment with each other with high accuracy.

This allows accurate detection of the pressure applied to the diaphragm portion 15, by the detector portion 19. In addition, dimensions of the thinned portion 17 and the detector portion 19 can be reduced. Then, the dimension of the diaphragm portion 15 can be reduced as compared with the conventionally used one. This contributes to reduction of the size of the pressure sensor.

The use of the piezoresistive elements 19 strainable in response to the flexure at the thinned portion 17 of the diaphragm portion 15 makes the pressure sensor to detect the pressure value variably applied to the diaphragm portion 15.

The formation of the piezoresistive elements 19 by doping serves for enhancing the accurate positioning of the piezoresistive elements 19 within the recess 16.

The following fabrication sequences and the related diagrams illustrate the formation of the structure of the pressure sensor of the present invention.

FIGS. 3 through 14, demonstrate the fabrication of the pressure sensor of the first embodiment shown in FIGS. 1 and 2.

Figure 3:
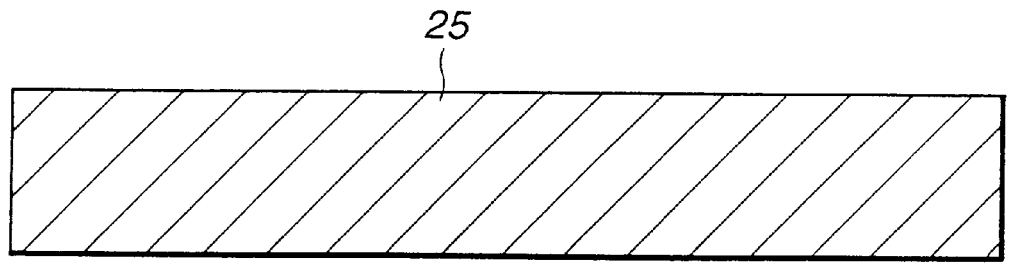
FIG. 3 is a cross-section of a monocrystalline silicon base as a starting material used in the first embodiment.

FIG. 3 illustrates a base 25 made of single crystal silicon which serves as a starting material. The monocrystalline silicon base 25 is placed inside apparatus for fabricating the pressure sensor, not shown. The monocrystalline silicon base 25 is of a P-conductivity type which may be formed by doping impurity, for example, boron, thereinto.

Figure 4:
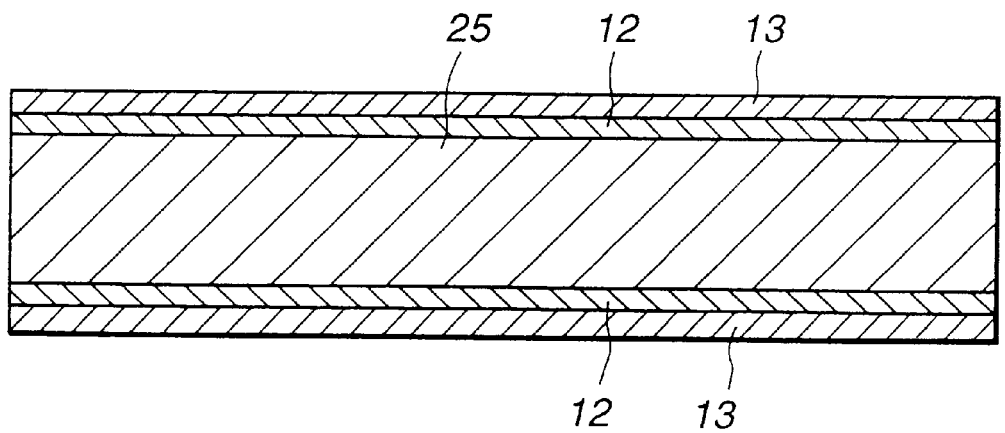
FIGS. 4–7 are cross-sections showing the process of preparing a substrate of the pressure sensor of the first embodiment.

A film of silicon dioxide 12 as a passivation film is deposited on opposite, upper and lower, surfaces of the monocrystalline silicon base 25 as shown in FIG. 4. A film of silicon nitride 13 as a passivation film is deposited on the silicon dioxide film 12 on each of the upper and lower surfaces of the monocrystalline silicon base 25.

Figure 5:
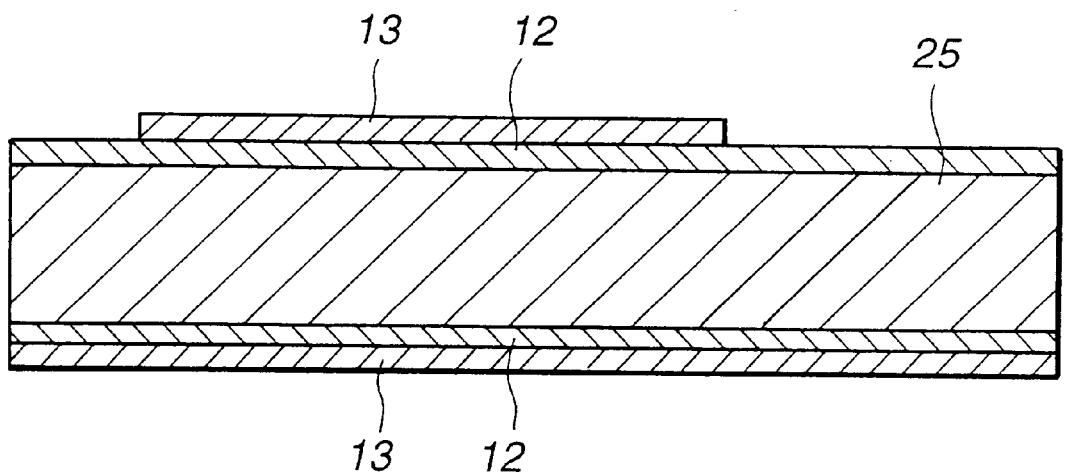

As shown in FIG. 5, the silicon nitride film 13 over the upper surface of the monocrystalline silicon base 25 is selectively removed by lithographical and etching techniques to partially expose the monocrystalline silicon base 25 thereunderneath. In this process, a portion of the monocrystalline silicon base 25 which is formed into a surface layer 11B shown in FIG. 7, in the subsequent processes, is left covered with the remainder of the silicon nitride film 13.

Figure 6:
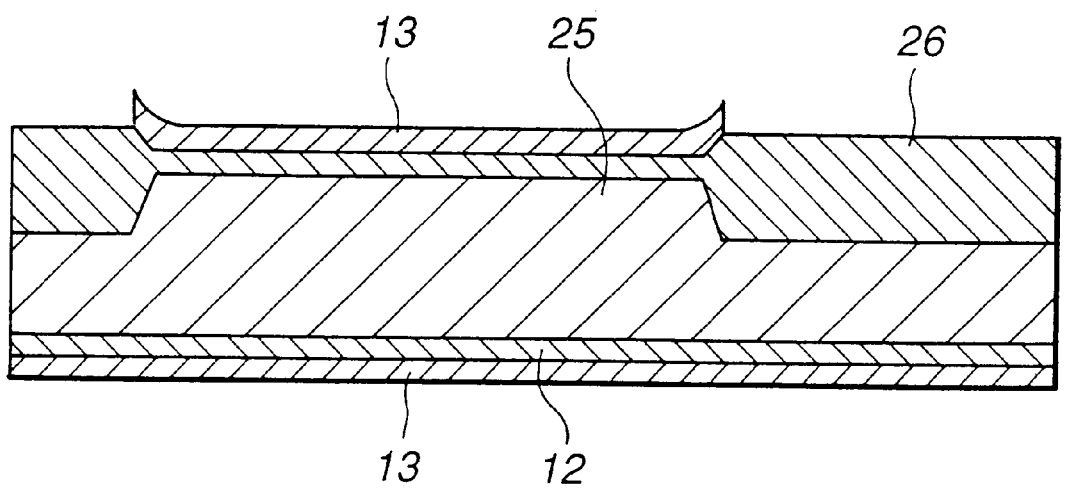

A film of silicon dioxide 26 is grown onto the monocrystalline silicon base 25 by oxidizing the exposed portion of the monocrystalline silicon base 25 in an ambient containing oxygen, as shown in FIG. 6. This process is often referred to as LOCOS, for local oxidization of silicon. The grown silicon dioxide film 26 having an increased thickness is thus deposited on the upper surface of the monocrystalline silicon base 25.

Figure 7:
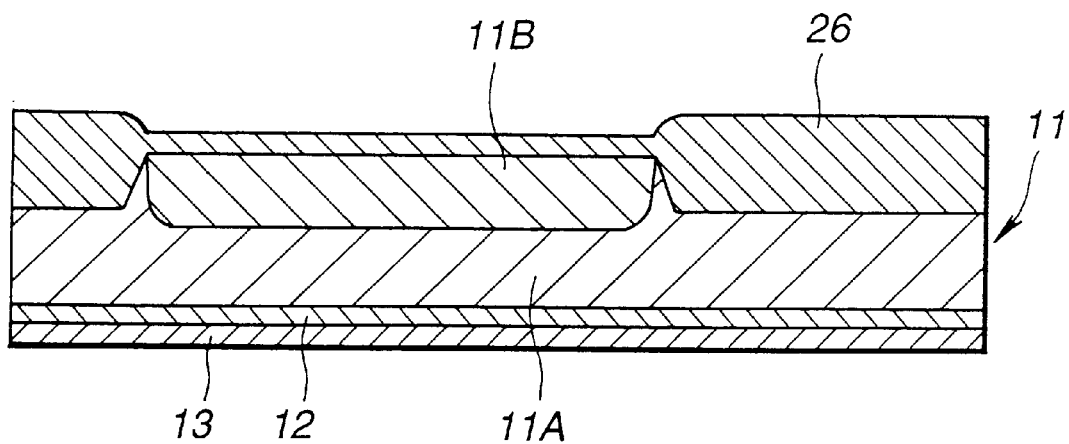

The remainder of the silicon nitride film 13 on the upper surface of the monocrystalline silicon base 25 is then removed to expose the silicon dioxide film thereunderneath. The monocrystalline silicon base 25 underlying the exposed portion of the silicon dioxide film is now doped with impurity, for instance, phosphorous, to be formed into the surface layer 11B of the N-conductivity type. This doping process may be conducted using ion implantation. Thus, the surface layer 11B of the N-conductivity type is grown onto the base 11A of the P-conductivity type, cooperating with the base 11A to form the substrate 11 as shown in FIG. 7.

Figure 8:
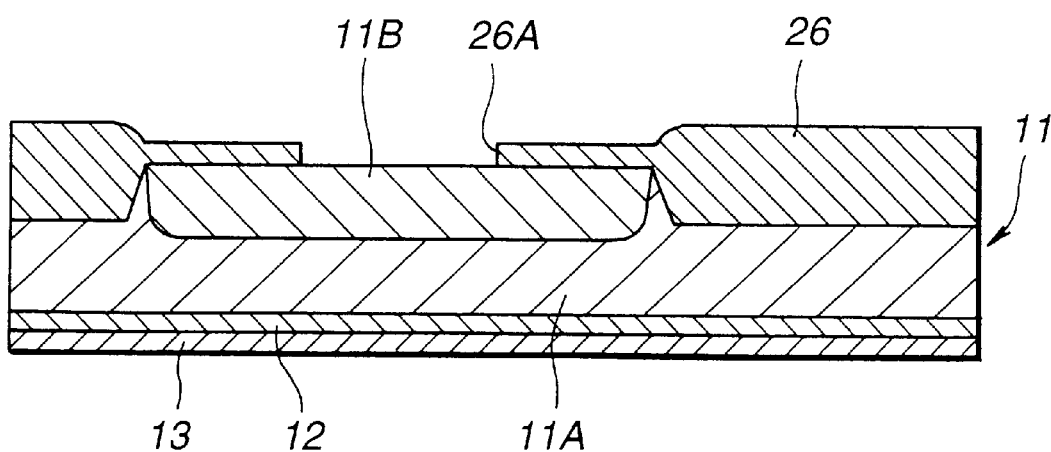
FIGS. 8–10 are cross-sections showing the process of forming a recess in the substrate shown in FIG. 7.

An aperture 26A is formed in the silicon dioxide film overlying a portion of the surface layer 11B where the recess 16 is formed in the subsequent process, by removing the corresponding portion of the silicon dioxide film using lithographical and etching techniques, as shown in FIG. 8.

Figure 9:
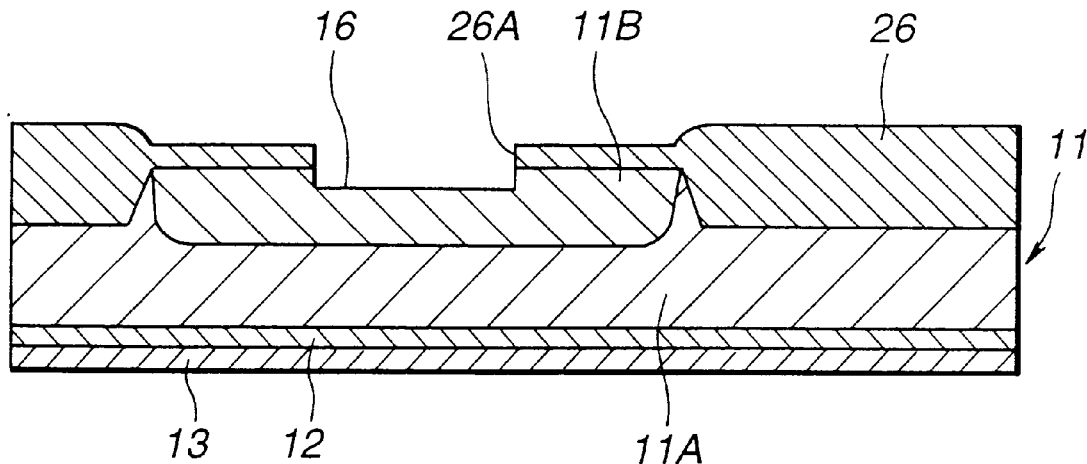

The portion of the surface layer 11B which is exposed through the aperture 26A, is removed by dry etching to form the recess 16 in the surface layer 11B, as shown in FIG. 9. The silicon dioxide film 26 acts as a mask in this process.

Figure 10:
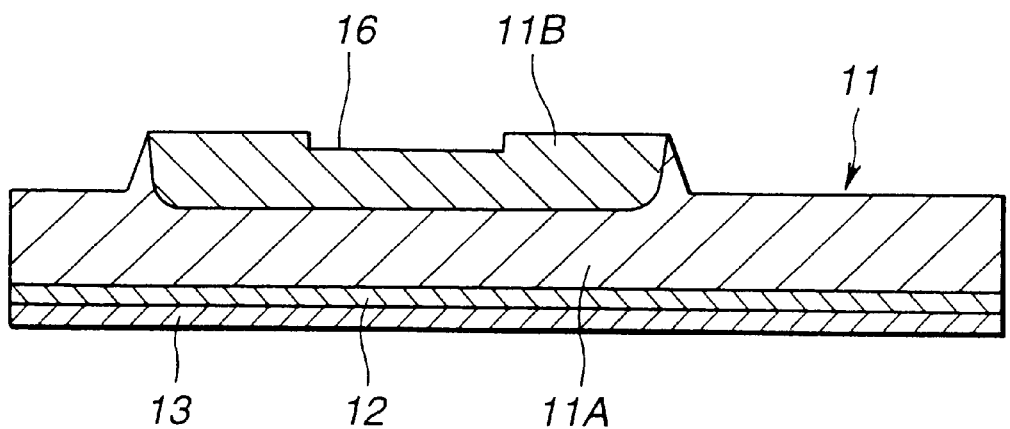

The remainder of the silicon dioxide film 26 on the upper surface of the substrate 11 is entirely etched away as shown in FIG. 10.

Figure 11:
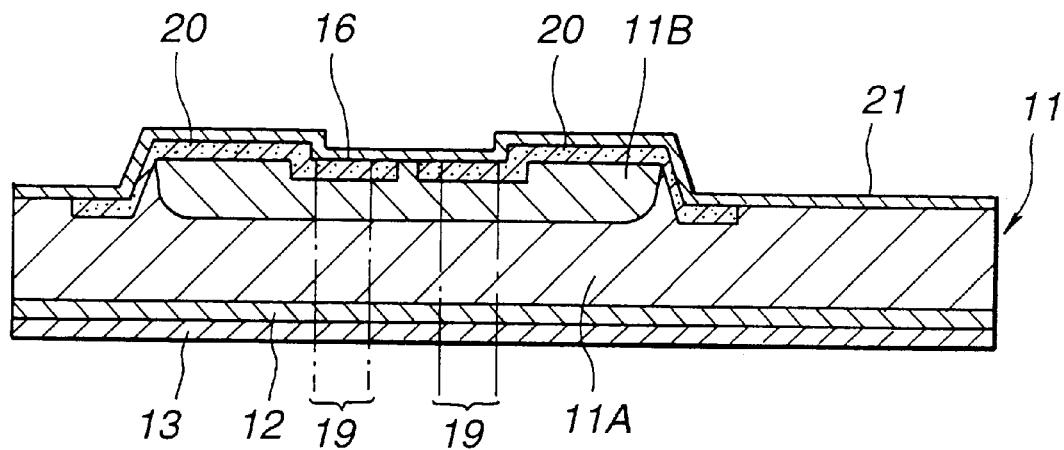
FIGS. 11–13 are cross-sections showing the process of placing a pressure sensitive arrangement in the substrate shown in FIG. 10.

A detector portion 19 of a pressure sensitive arrangement is formed by doping impurity, for instance, boron, into a portion of the surface layer 11B which defines the recess 16. The detector portion 19 is so disposed as to be within at least a part of the recess 16. The detector portion 19 may be formed of a plurality of elongated rectangular-shaped piezoresistive elements of the P-conductivity type which are disposed along inside a periphery of the bottom surface of the recess 16 in spaced relation to each other. In this process, diffused leads 20 are formed in predetermined regions of the substrate 11, substantially along the upper-side face of the surface layer 11B, as shown in FIG. 11. The insulator film of an electrically insulating material 21 is conformally deposited on the upper surface of the substrate 11. The insulator film 21 may be made of silicon dioxide.

Figure 12:
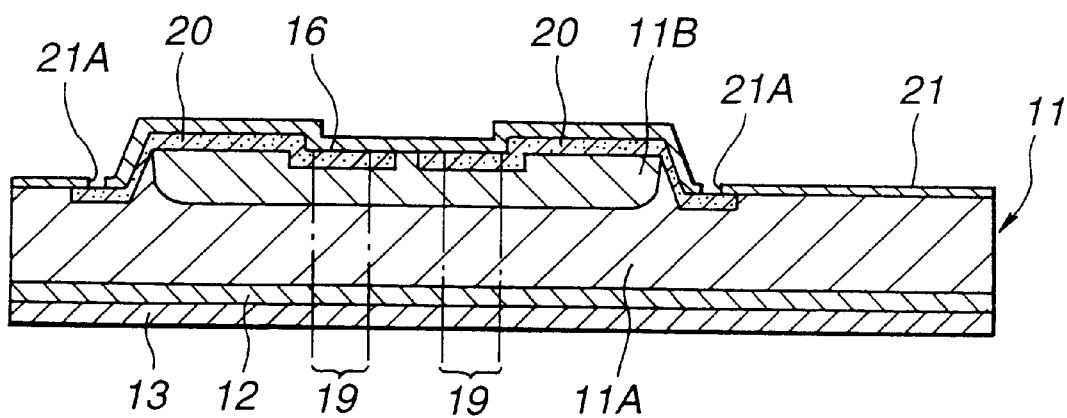

As illustrated in FIG. 12, contact holes 21A are formed in the insulator film 21 for connection of the detector portion 19 with electrically conductive films 22 deposited in the following process.

Figure 13:
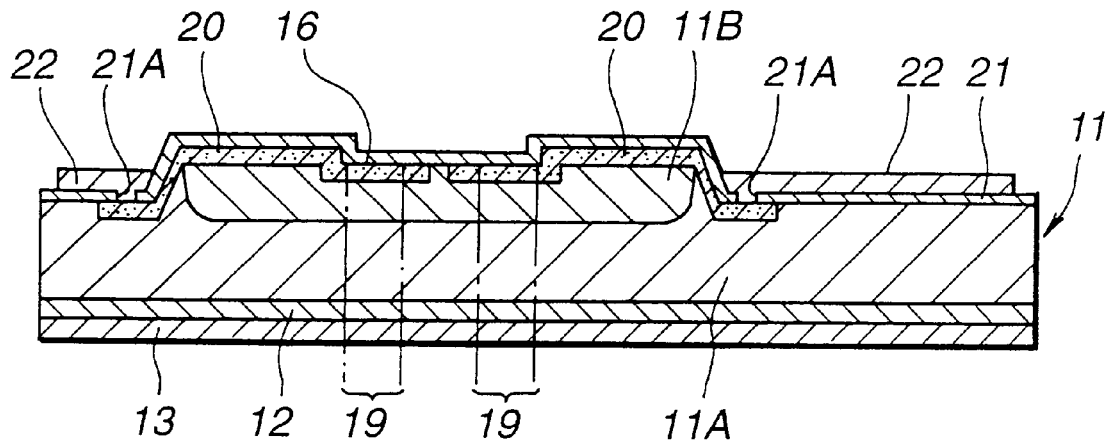

The electrically conductive films 22 may be deposited on the insulator film 21 by vacuum deposition, as shown in FIG. 13.

Figure 14:
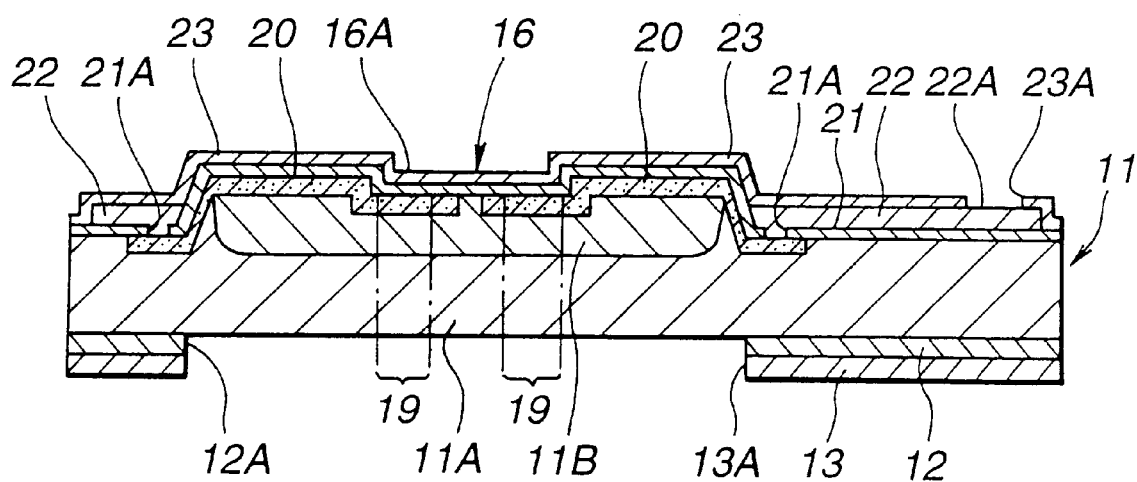
FIG. 14 is a cross-section showing the process of forming a recess in the substrate shown in FIG. 13.

A protective film 23 is conformally deposited over the entire upper surface of the substrate 11, as shown in FIG. 14. The protective film 23 has a portion which overlies the insulator film 21 in the recess 16 to form an outer recessed surface 16A. A contact hole 23A is formed to define a bonding pad region corresponding to an electrode 22A of the electrically conductive film 22, in the protective film 23. The silicon dioxide film 12 and the silicon nitride film 13 on the lower surface of the substrate 11 are selectively removed by lithographical and etching techniques to form apertures 12A and 13A, respectively, corresponding to a diaphragm-defining recess 14 formed in the following process.

The substrate 11 is now removed through the apertures 12A and 13A by anisotropic etching using, for instance, potassium hydroxide, hydrazine, ethylenediamine pyrocatechol or the like. The anisotropic etching is terminated at an interface between the base 11A and the surface layer 11B by using an electrochemical etch stopping technique in which positive voltage is applied to the surface layer 11B of the N-conductivity type. The diaphragm-defining recess 14 is thus formed in the substrate 11 as shown in FIG. 1.

A lid 24 is placed onto the thicker portion 18 of the diaphragm portion 15 which is covered with the insulator film 21 and the protective film 23, and then fixed thereto by a suitable manner such as anode coupling.

Referring now to FIGS. 15–27, a second embodiment of the pressure sensor and the method for forming the same, according to the present invention, is explained. This embodiment differs in use of a silicon-on-insulator (SOI) substrate as the substrate of the pressure sensor, from the above-described first embodiment.

Figure 15:
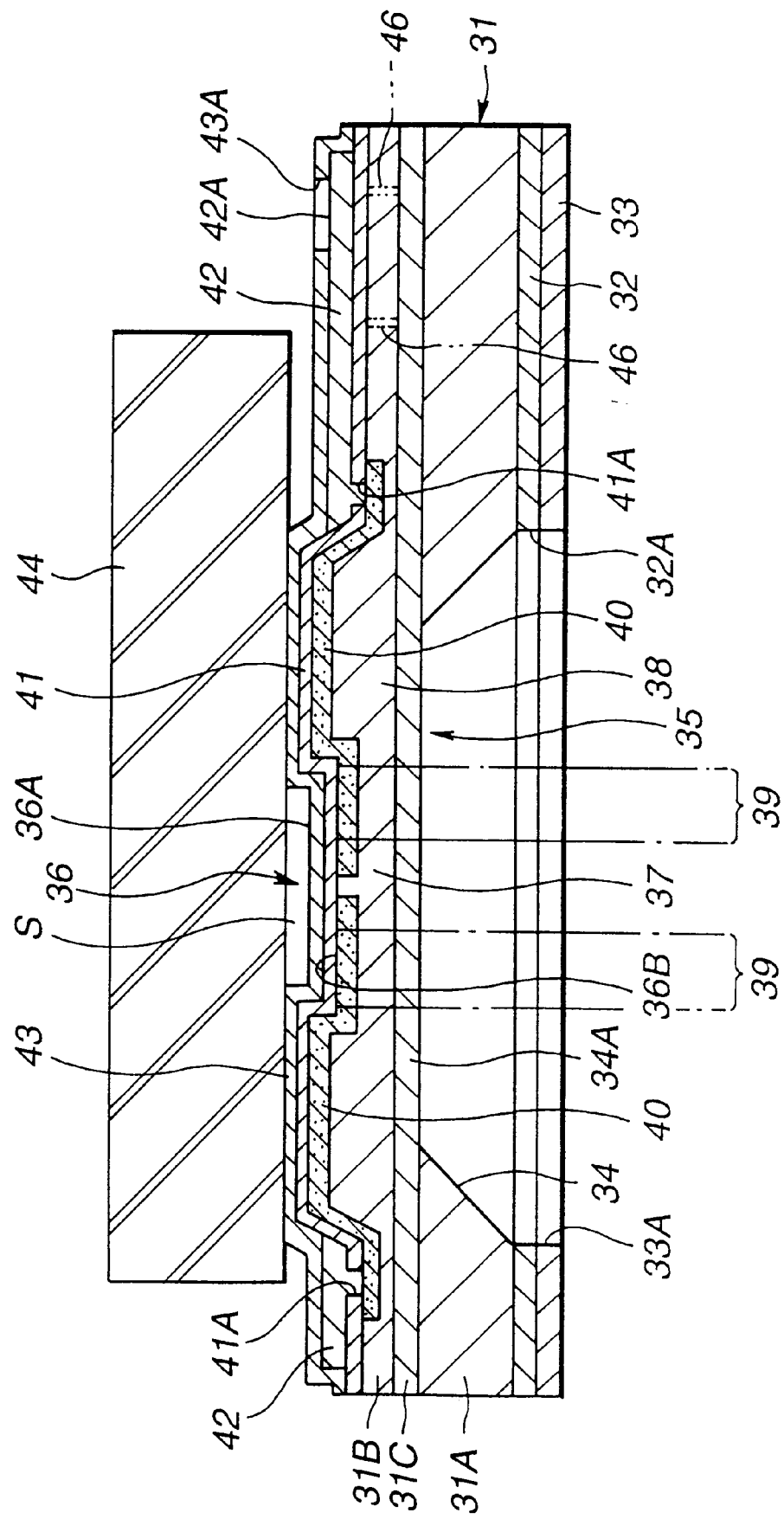
FIG. 15 is a cross-section similar to FIG. 1 but showing a pressure sensor of a second embodiment according to the present invention.

As illustrated in FIG. 15, the pressure sensor includes the SOI substrate 31. The SOI substrate 31 is of a generally rectangular shape similar to the substrate 11 of the first embodiment. The SOI substrate 31 includes a base 31A made of single crystal silicon, an insulator film 31C of an electrically insulating material deposited on the base 31A, and a surface layer 31B of a silicon based material, for example, polysilicon, deposited on the insulator film 31C. The insulator film 31C is interposed between the base 31A and the surface layer 31B and may be made of silicon dioxide. The surface layer 31B may be of an N-conductivity type formed by doping impurity such as phosphorous thereinto and have a thickness of approximately 5–20 μm. Deposited on a rearside surface of the base 31A is a silicon dioxide film 32 on which a silicon nitride film 33 is deposited.

A diaphragm-defining recess 34 is substantially centered on the base 31A. The recess 34 is recessed inwardly from the rearside surface of the base 31A to define a diaphragm portion 35 of the SOI substrate 31 between a generally rectangular-shaped planar bottom surface 34A of the recess 34 and an upper-side face of the surface layer 31B. The recess 34 extends through the base 31A to be open to an upper-side surface of the base 31A. The recess 34 is thus opposed to a rearside surface of the insulator film 31C. The recess 34 may be formed by etching the base 31A through apertures 32A and 33A which are formed in the silicon dioxide film 32 and the silicon nitride film 33, respectively. The recess 34 acts as a pressure port through which a pressure is applied to the pressure sensor, as well as the recess 14 of the aforementioned first embodiment.

The diaphragm portion 35 is defined by the generally rectangular-shaped bottom surface 34A of the recess 34. The diaphragm portion 35 has a width corresponding to the bottom surface 34A and a predetermined thickness, as well as the diaphragm portion 15 of the aforementioned first embodiment. The diaphragm portion 35 has a thinned portion 37 defined by a recess 36 as explained later, and a thicker portion 38 disposed around the thinned portion 37 and the recess 36.

The recess 36 is disposed within the diaphragm portion 35 and in the form of a shallow rectangular-shaped groove similar to the recess 16 of the aforementioned first embodiment. The recess 36 is recessed inwardly from the upper-side face of the surface layer 31B of the SOI substrate 31. The recess 36 is defined by a recessed surface 36B of the surface layer 31B. The recessed surface 36B includes a planar bottom surface of a generally rectangular shape which is defined by four line segments, each having a predetermined length as well as the recess 16 of the aforementioned first embodiment. The bottom surface of the recessed surface 36B of the recess 36 has a smaller area than that of the bottom surface 34A of the recess 34.

The thinned portion 37 of the diaphragm portion 35 extends between the bottom surface of the recessed surface 36B and the bottom surface 34A of the recess 34. Thus, the thinned portion 37 includes the surface layer 31B and the insulator film 31C which are disposed between the bottom surface of the recessed surface 36B and the bottom surface 34A of the recess 34. The thinned portion 37 has the predetermined width and thickness and is flexibly deformable in response to a pressure applied to the diaphragm portion 35, as well as the thinned portion 17 of the aforementioned first embodiment.

The thicker portion 38 of the diaphragm portion 35 has a generally rectangular frame-like shape having a predetermined width, for example, of approximately 10–30 μm. The thicker portion 38 includes the surface layer 31B and the insulator film 31C which are disposed between an upper-side face of the diaphragm portion 35 and the bottom surface 34A of the recess 34. The thicker portion 38 has a predetermined thickness greater than the thickness of the thinned portion 37, similar to the thicker portion 18 of the aforementioned first embodiment.

A plurality of piezoresistive elements 39 as a detector portion of a pressure sensitive arrangement are disposed within the recess 36, which detect flexure generated in the thinned portion 37 of the diaphragm portion 35. In this embodiment, four piezoresistive elements 39 are placed inside along the periphery of the thinned portion 37, two of which are shown in FIG. 15. Each of the piezoresistive elements 39 is formed by doping impurity such as boron into the surface layer 31B of the substrate 31 and then being configured to a generally elongated rectangular shape.

Diffused leads 40 are disposed on predetermined portions of the surface layer 31B of the SOI substrate 31. The diffused leads 40 are formed by doping impurity into the predetermined portions of the surface layer 31B. Similar to the diffused lead of the aforementioned first embodiment, each of the diffused leads 40 has one end portion disposed within the recess 36 of the diaphragm portion 35 and an opposite end portion extending outside the recess 36. The one end portion of the diffused lead 40 is connected with each piezoresistive element 39 and the opposite end portion thereof is connected with an electrically conductive film 42 as explained later.

An insulator film 41 of an electrically insulating material is deposited on the upper-side face of the surface layer 31B of the substrate 31. The insulator film 41 may be made of silicon dioxide, as well as the insulator film 21 of the aforementioned first embodiment. The insulator film 41 is conformally deposited on the recess 36 to cover the piezoresistive elements 39 and the diffused leads 40. The insulator film 41 has contact holes 41A each positioned corresponding to the opposite end portion of the diffused lead 40.

The electrically conductive films 42 are deposited on predetermined regions of the upper-side face of the surface layer 31B through the insulator film 41. Each of the electrically conductive film 42 may be made of metals such as aluminum. The electrically conductive film 42 has one end portion connected with the diffused lead 40 through the contact hole 41A of the insulator film 41. The electrically conductive film 42 has the other end outside the diaphragm portion 35 which forms an electrode 42A connected to an external detecting circuit, not shown.

With the pressure sensitive arrangement as described above, an output signal indicative of the pressure detected by each piezoresistive element 39 is introduced into the external detecting circuit.

A protective film 43 of an electrically insulating material is conformally deposited overall on the upper-side face of the surface layer 31B of the SOI substrate 31. The protective film 43 covers the electrically conductive films 42 and overlaps the insulator film 41 on the diaphragm portion 35. The protective film 43 has contact holes 43A for electrical connection of the electrically conductive films 42 with the external detecting circuit, each being located corresponding to the electrode 42A of the electrically conductive film 42. FIG. 15 shows merely one of the contact holes 43A corresponding to the electrode 42A for simple illustration.

Thus, the recess 36 is covered with the insulator film 41 and the protective film 43 which are extremely thinned and conformally deposited on the recess 36. An outer recessed surface 36A similar in shape to the recessed surface 36B is located on the protective film 43.

A lid 44 is fixedly mounted to the thicker portion 38 of the diaphragm portion 35 of the substrate 31 via the insulator film 41 and the protective film 43. The lid 44 covers the recess 36 and the detector portion 39 within the recess 36. The lid 44 is made of such a rigid material as to reinforce the thicker portion 38. The lid 44 may be secured to the thicker portion 38 by anode coupling, as well as the lid 24 of the aforementioned first embodiment. The lid 44 and the diaphragm portion 35 cooperate to define a reference pressure chamber S between the outer recessed surface 36A of the recess 36 and a surface of the lid 44 which is opposed to the recess 36. When a pressure is applied to the diaphragm portion 35 via the recess 34, the thinned portion 37 of the diaphragm portion 35 is flexibly deformable by a differential pressure between the reference pressure chamber S and the recess 34.

Insulator walls 46 may be formed in the surface layer 31B as indicated by a phantom line in FIG. 15. The insulator walls 46 can define a region of the surface layer 31B which is electrically isolated from the remainder of the surface layer 31B. This serves for readily forming an active device, for instance, MOS transistor, on the SOI substrate 31. Such active device as wave-shaping circuit for amplification of the output signal from the piezoresistive elements 39, may be formed integrally with the pressure sensor.

The pressure sensor of the second embodiment can exhibit substantially same function and effects as those of the pressure sensor of the aforementioned first embodiment.

Referring to FIGS. 16–27, the method of fabricating the pressure sensor shown in FIG. 15 will be explained hereinafter. The fabrication processes are conducted in the following sequence.

Figure 16:
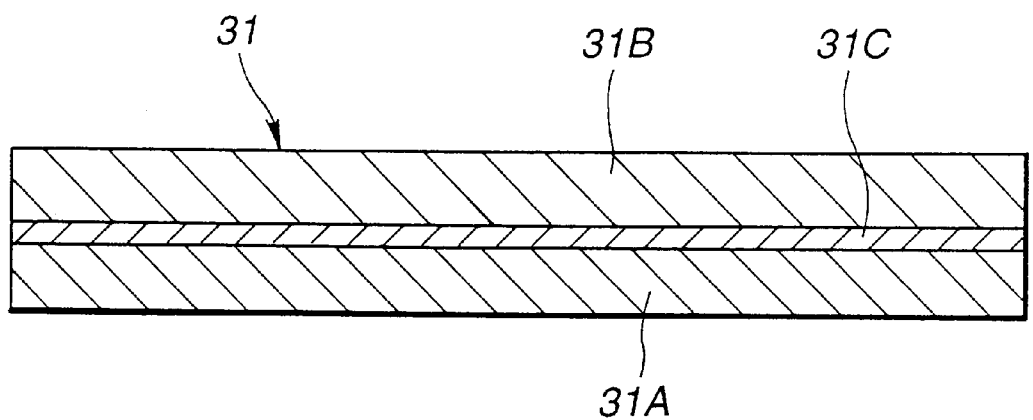
FIGS. 16–17 are cross-sections showing the process of preparing a substrate of the pressure sensor shown in FIG. 15.

As illustrated in FIG. 16, a silicon-on-insulator (SOI) substrate 31 is provided as a starting material, which includes a base of monocrystalline silicon 31A, a surface layer of a silicon based material 31B, and an insulator film of an electrically insulating material 31C deposited between the base 31A and the surface layer 31B.

Figure 17:
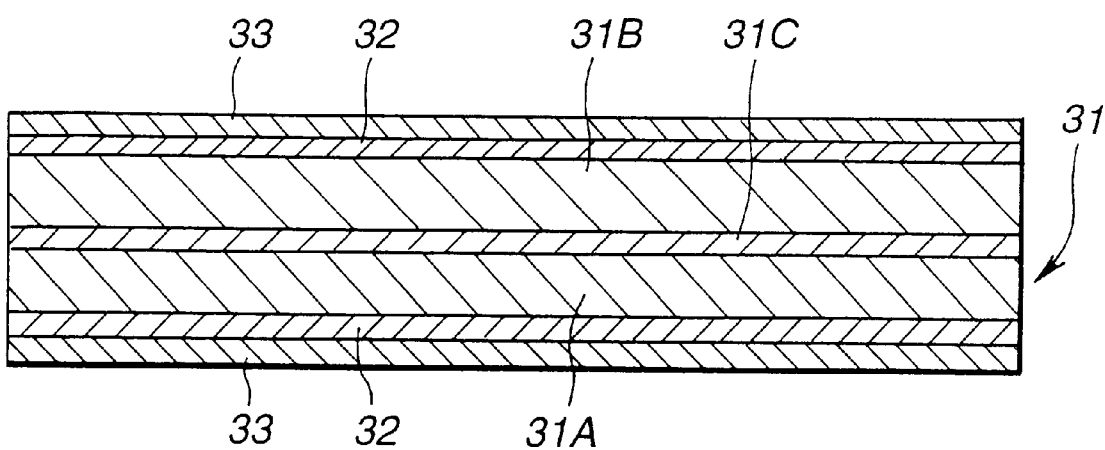

As illustrated in FIG. 17, a film of silicon dioxide 32 as a passivation film is deposited on opposed surfaces of the SOI substrate 31. A film of silicon nitride 33 as a passivation film is deposited on the silicon dioxide film 32 on each of the opposed surfaces of the substrate 31.

Figure 18:
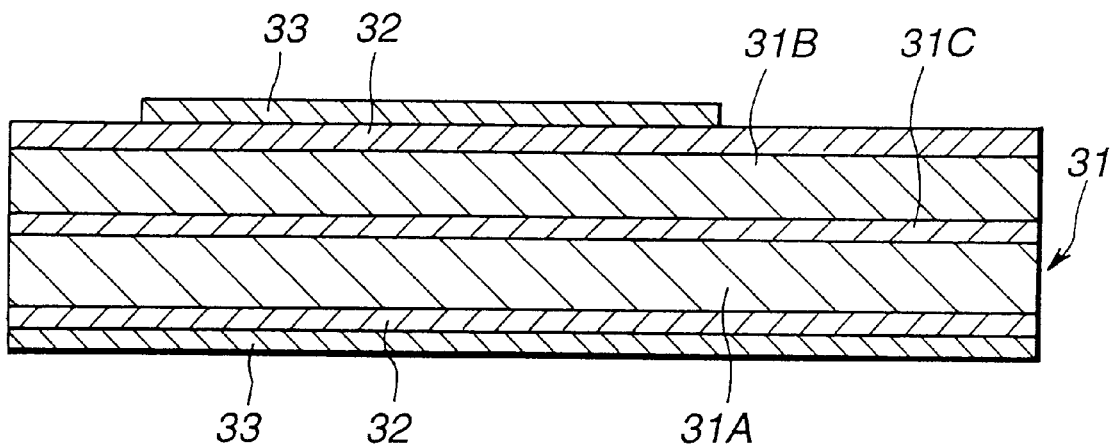
FIGS. 18–23 are cross-sections showing the process of forming a recess in the substrate shown in FIG. 17.

As shown in FIG. 18, the silicon nitride film 33 over the upper surface of the SOI substrate 31 is selectively removed by lithographical and etching techniques such that a diaphragm portion 35 formed in the subsequent processes, is left covered with the remainder of the silicon nitride film 33.

Figure 19:
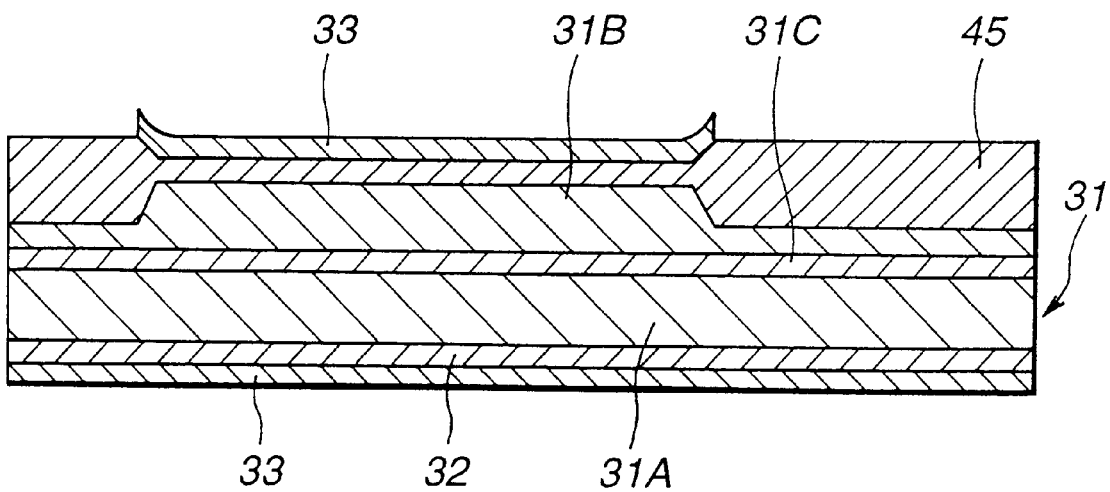

A film of silicon dioxide 45 is grown onto a portion of the surface layer 31B which is uncovered with the silicon nitride film 33, using LOCOS of the portion of the surface layer 31B in an ambient containing oxygen, as shown in FIG. 19. The grown silicon dioxide film 45 having an increased thickness is thus deposited on the upper-side face of the surface layer 31B. A portion of the surface layer 31B raised as mesa is formed, in which the diaphragm portion 35 is formed by the subsequent processes.

Figure 20:
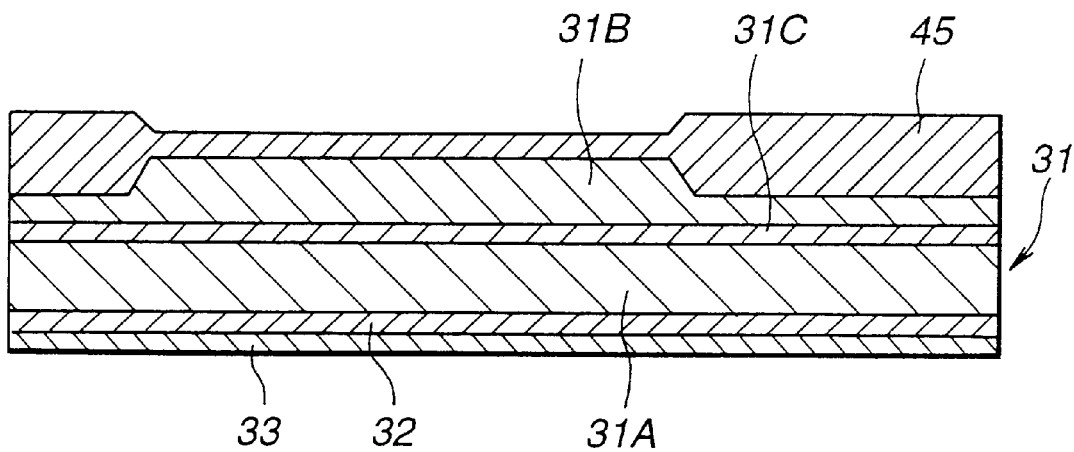

The remainder of the silicon nitride film 33 over the upper-side face of the surface layer 31B is then removed to expose the silicon dioxide film thereunderneath, as shown in FIG. 20.

Figure 21:
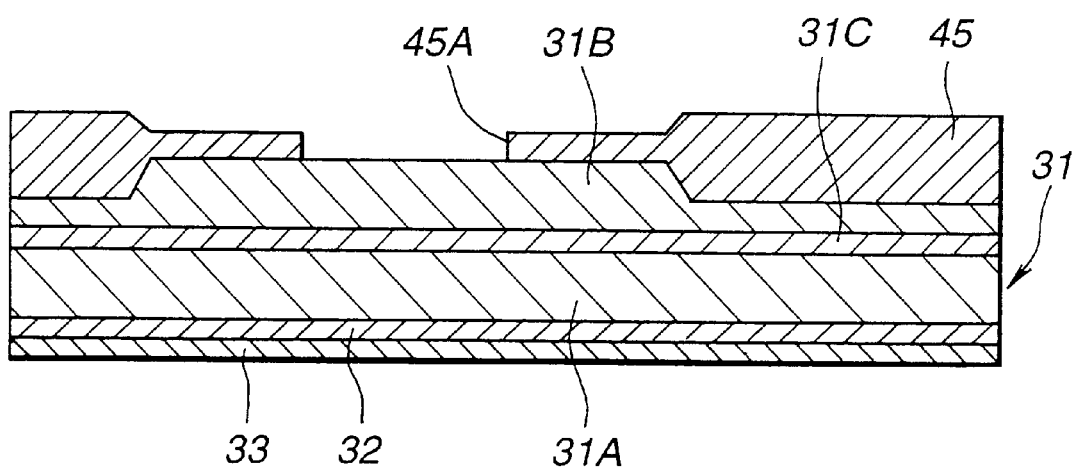

An aperture 45A is formed in the silicon dioxide film by selectively removing the exposed silicon dioxide film using lithographical and etching techniques, as shown in FIG. 21. The aperture 45A is open to an upper face of the mesa-like portion of the surface layer 31B.

Figure 22:
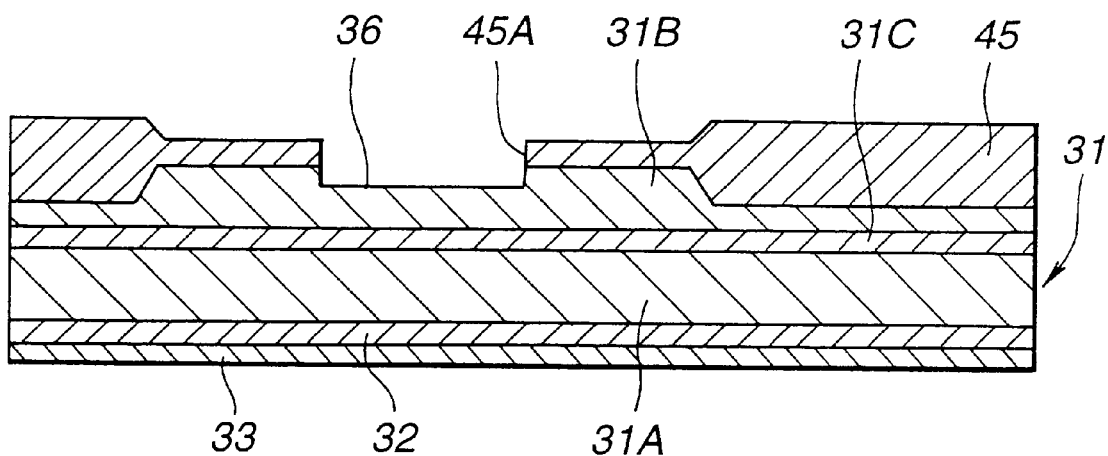

The mesa-like portion of the surface layer 31B is removed by dry etching through the aperture 45A to form the recess 36 recessed inwardly from the upper-side face of the surface layer 31B, as shown in FIG. 22. The silicon dioxide film 45 acts as a mask in this process.

Figure 23:
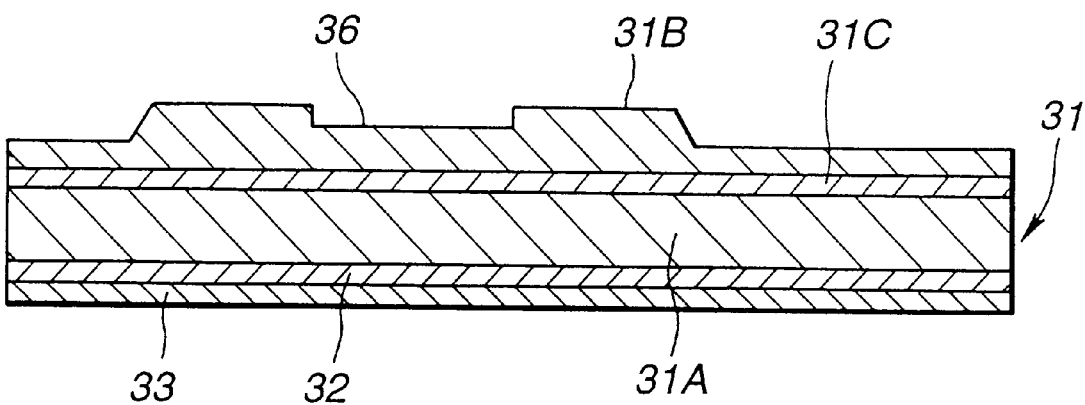

The remainder of the silicon dioxide film 45 on the upper-side face of the surface layer 31B is entirely etched away as shown in FIG. 23. The surface layer 31B may be doped with impurity, for instance, phosphorous, to be formed into an N-conductivity type.

Figure 24:
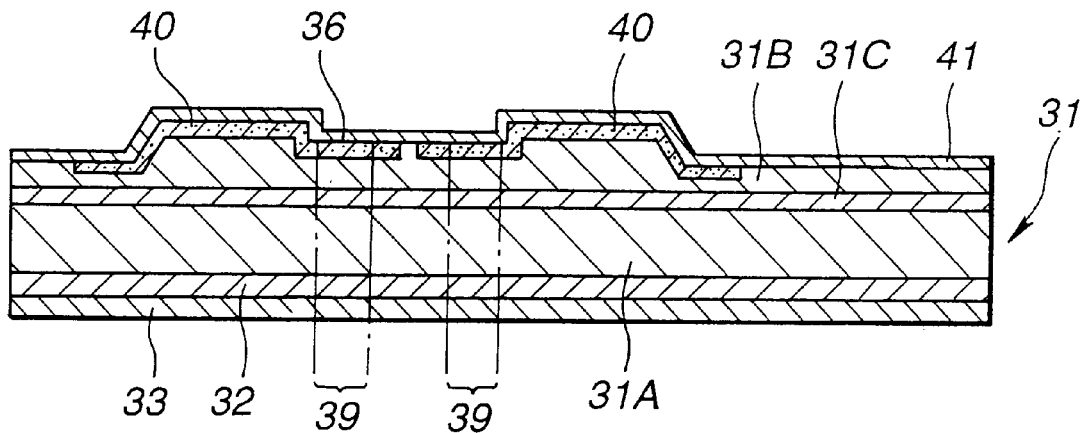
FIGS. 24–26 are cross-sections showing the process of placing a pressure sensitive arrangement in the substrate shown in FIG. 23.

A detector portion 39 of a pressure sensitive arrangement is formed by doping impurity, for instance, boron, into a portion of the surface layer 31B which defines the recess 36, as shown in FIG. 24. The detector portion 39 is so disposed as to be within at least a part of the recess 36. The detector portion 39 may be formed of a plurality of elongated rectangular-shaped piezoresistive elements of a P-conductivity type which are disposed along inside a periphery of a planar bottom surface of the recess 36 in spaced relation to each other. In this process, diffused leads 40 are formed in predetermined regions of the surface layer 31B, substantially along the upper-side face of the surface layer 31B. The insulator film of an electrically insulating material 41, for instance, silicon dioxide, is conformally deposited on the upper-side face of the surface layer 31B.

Figure 25:
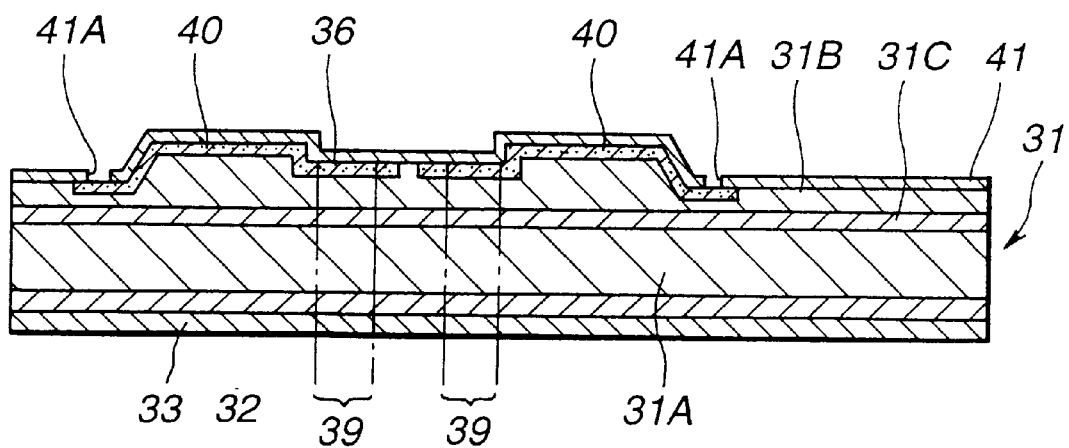

As illustrated in FIG. 25, contact holes 41A are formed in the insulator film 41 for connection of the detector portion 39 and the diffused leads 40 with electrically conductive films 42 deposited in the following process.

Figure 26:
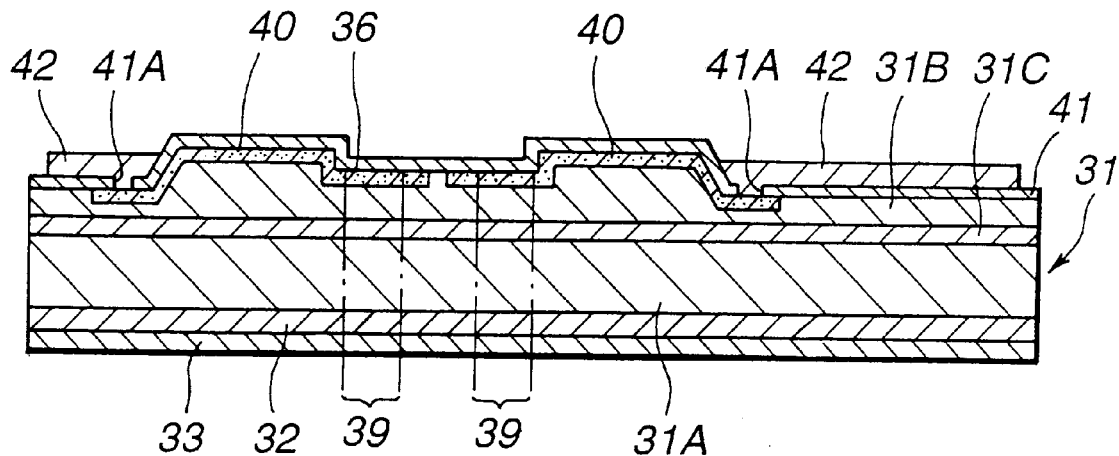

The electrically conductive films 42 may be deposited on the insulator film 21 by sputtering, vacuum deposition or the like, as shown in FIG. 26.

Figure 27:
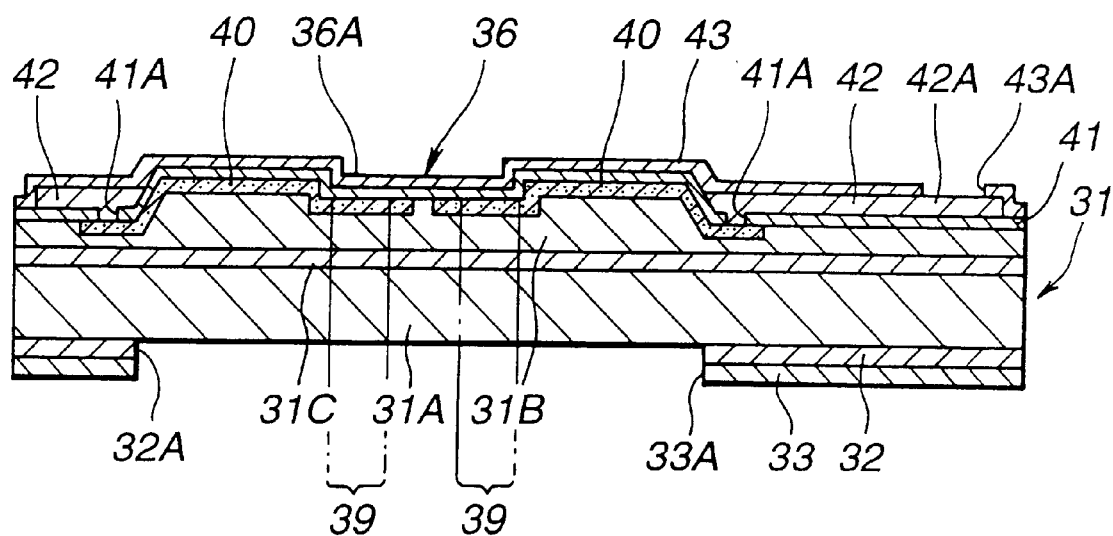
FIG. 27 is a cross-section showing the process of forming a recess in the substrate shown in FIG. 26.

A protective film 43 is conformally deposited on the entire upper-side face of the surface layer 31B, as shown in FIG. 27. The protective film 43 has a portion which overlies the insulator film 41 in the recess 36 to form an outer recessed surface 36A. A contact hole 43A is formed to define a bonding pad region corresponding to an electrode 42A of the electrically conductive film 42, in the protective film 43. The silicon dioxide film 32 and the silicon nitride film 33 on the lower surface of the base 31A of the SOI substrate 31 are selectively removed by lithographical and etching techniques to form apertures 32A and 33, respectively, corresponding to a diaphragm-defining recess 34 formed in the following process.

The base 31A of the SOI substrate 31 is now removed through the apertures 32A and 33A by anisotropic etching. The anisotropic etching is stopped at an interface between the base 31A and the insulator film 31C. The diaphragm-defining recess 34 is thus formed in the base 31A as shown in FIG. 15.

A lid 44 is placed onto the upper-side face of the thicker portion 38 of the diaphragm portion 35 which is covered with the insulator film 31 and the protective film 33, and then fixed thereto by a suitable connecting manner such as anode coupling.

In the second embodiment of the pressure sensor employing the SOI substrate, the process of depositing the surface layer 11b of the N-conductivity type on the base 11A as explained in the first embodiment, can be omitted. This contributes to reduction of time required for fabricating the pressure sensor.

Further, since the etching of the base 31A for forming the diaphragm-defining recess 34 is stopped at the interface between the base 31A and the insulator film 31C, a large number of pressure sensors having the recess 34 of substantially equal depth may be formed from one SOI substrate 31. This allows the pressure sensors to generate substantially equivalent output signals upon a pressure being applied thereto.

Referring to FIGS. 28–39, a third embodiment of the pressure sensor and the method for forming the same, according to the present invention, is explained. This embodiment differs in that an SOI substrate 51 similar to the SOI substrate 31 of the aforementioned second embodiment is used and a recess 56 for the detector portion of the pressure sensitive arrangement is formed by LOCOS, from the above-described first embodiment.

Figure 28:
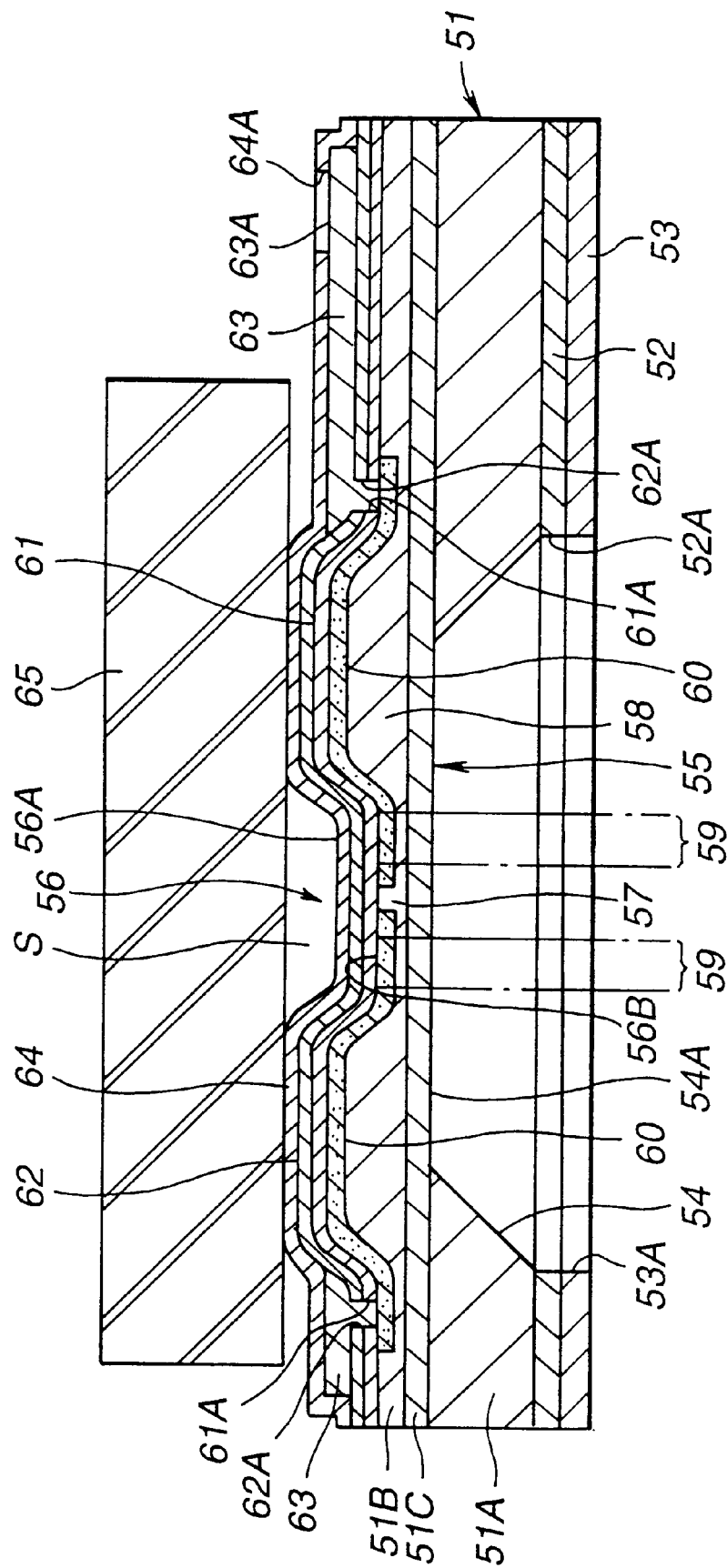
FIG. 28 is a cross-section similar to FIG. 1 but showing a pressure sensor of a third embodiment according to the present invention.

As illustrated in FIG. 28, the pressure sensor includes the SOI substrate 51 of a generally rectangular shape similar to the SOI substrate 31 of the second embodiment. The SOI substrate 51 includes a base 51A made of single crystal silicon, an insulator film 51C of an electrically insulating material deposited on the base 51A, and a surface layer 51B of a silicon based material, for example, polysilicon, deposited on the insulator film 51C. The insulator film 51C is interposed between the base 51A and the surface layer 51B and may be made of silicon dioxide. The surface layer 51B is of an N-conductivity type formed by doping impurity such as phosphorous thereinto. Deposited on a rearside surface of the base 51A is a silicon dioxide film 52 on which a silicon nitride film 53 is deposited.

A diaphragm-defining recess 54 is substantially centered on the base 51A. The recess 54 is recessed inwardly from the rearside surface of the base 51A to define a diaphragm portion 55 of the SOI substrate 51 between a generally rectangular-shaped planar bottom surface 54A of the recess 54 and an upper-side face of the surface layer 51B. The recess 54 extends through the base 51A to be open to an upper-side surface of the base 51A. The recess 54 is opposed to a rearside surface of the insulator film 51C. The recess 54 may be formed by etching the base 51A through apertures 52A and 53A which are formed in the silicon dioxide film 52 and the silicon nitride film 53, respectively. The recess 54 acts as a pressure port through which a pressure is applied to the pressure sensor, as well as the recess 34 of the aforementioned second embodiment.

The diaphragm portion 55 is defined by the bottom surface 54A of the recess 54. The diaphragm portion 55 has a width corresponding to the bottom surface 54A and a predetermined thickness, as well as the diaphragm portion 35 of the aforementioned second embodiment. The diaphragm portion 55 has a thinned portion 57 defined by a planar bottom surface of the recess 56, and a thicker portion 58 surrounding the thinned portion 57 and the recess 56. The thinned portion 57 includes the surface layer 51B and the insulator film 51C which are disposed between the bottom surface of the recess 56 and the bottom surface 54A of the recess 54. The thinned portion 57 has the predetermined width and thickness and is flexibly deformable in response to a pressure applied to the diaphragm portion 55, as well as the thinned portion 37 of the aforementioned second embodiment. The thicker portion 58 has a generally rectangular frame-like shape having a predetermined width of approximately 10–30 μm, similar to the second embodiment. The thicker portion 58 includes the surface layer 51B and the insulator film 51C which are disposed between an upper-side face of the diaphragm portion 55 and the bottom surface 54A of the recess 54. The thicker portion 58 has a predetermined thickness greater than the thickness of the thinned portion 37.

The recess 56 is disposed within the diaphragm portion 55 of the surface layer 51B of the SOI substrate 51. The recess 56 is formed by LOCOS into a rectangular-shaped groove. The recess 56 is recessed inwardly from the upper-side face of the surface layer 51B and is defined by a recessed surface 56B formed in the surface layer 51B. The recessed surface 56B includes the generally rectangular-shaped planar bottom surface 56B1 and four peripheral side surfaces 56B2 gently inclined relative to the bottom surface 56B1. The bottom surface 56B1 of the recess 56 has a smaller area than that of the bottom surface 54A of the recess 54, as well as the recess 36 of the aforementioned second embodiment.

Figure 29:
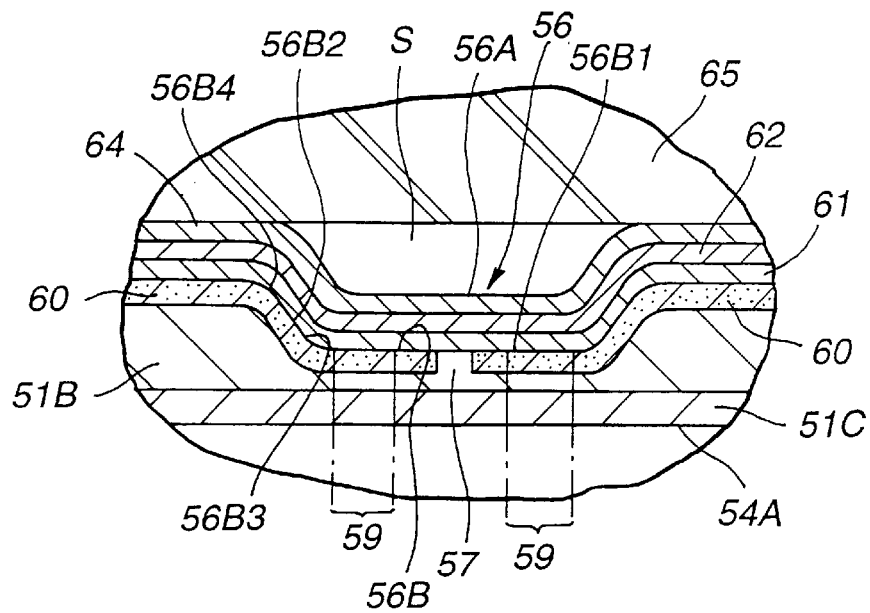
FIG. 29 is an enlarged fragmentary view of FIG. 28, showing a recess formed in a diaphragm portion of a substrate.

Specifically, as illustrated in FIG. 29, the bottom surface 56B1 and the inclined peripheral side surfaces 56B2 of the recessed surface 56B are connected with each other through an inner round beveled surface 56B3 having an arcuate-shaped section. The recessed surface 56B also includes an outer round beveled surface 56B4 disposed at an open end of the recess 56 and connects the peripheral side surfaces 56B2 with the upper-side face of the surface layer 51B which surrounds the open end of the recess 56. The outer round beveled surface 56B4 has an arcuate-shaped section as well as the inner round beveled surface 56B3. The inner and outer round beveled surfaces 56B3 and 56B4 are positioned along the periphery of the bottom surface 56B1. The inner round beveled surface 56B3 serves for reducing stress concentration at the connection between the bottom surface 56B1 and the peripheral side surfaces 56B2. The outer round beveled surface 56B4 serves for reducing stress concentration at the connection between the peripheral side surfaces 56B2 and the upper-side face of the surface layer 51B around the open end of the recess 56.

A plurality of piezoresistive elements 59, for example, four, as the detector portion as explained in the second embodiment, are disposed within the recess 56. The four piezoresistive elements 59 are placed inside along the recessed surface 56B, two of which are shown in FIG. 29. Each of the piezoresistive elements 59 is formed by doping impurity such as boron into the surface layer 51B of the SOI substrate 51 and then being configured to a generally elongated rectangular shape.

Diffused leads 60 are disposed on predetermined portions of the surface layer 51B of the SOI substrate 51, as well as the diffused leads 40 of the aforementioned second embodiment. The diffused leads 60 are formed by doping impurity into the predetermined portions of the surface layer 51B. Each of the diffused leads 60 has one end portion disposed within the recess 56 of the diaphragm portion 55 and an opposite end portion extending outside the recess 56. The one end portion of the diffused lead 60 is connected with each piezoresistive element 59 and the opposite end portion thereof is connected with an electrically conductive film 63 as explained later.

A surface film 61 of silicon dioxide is deposited on the surface layer 51B of the SOI substrate 51 by oxidizing the upper-side face of the surface layer 51B. The silicon dioxide film 61 is conformally deposited on the recess 56 to cover the piezoresistive elements 59 and the diffused leads 60. The silicon dioxide film 61 has contact holes 61A each positioned corresponding to the opposite end portion of the diffused lead 60.

An insulator film 62 of an electrically insulating material is conformally deposited on the silicon dioxide film 61 overlying the surface layer 51B. The insulator film 62 may be made of silicon dioxide similar to the insulator film 41 of the aforementioned second embodiment. The insulator film 62 has contact holes 62A, each being positioned corresponding to the opposite end portion of the diffused lead 60 as well as the contact holes 61A of the silicon dioxide film 61.

The electrically conductive films 63 are deposited on predetermined regions of the upper-side face of the surface layer 51B through the surface film 61 and the insulator film 62. Each of the electrically conductive film 63 may be made of metals such as aluminum. The electrically conductive film 63 has one end portion connected with the diffused lead 60 through the contact holes 61A and 62A respectively formed in the surface film 61 and the insulator film 62. The electrically conductive film 63 has the other end outside the diaphragm portion 55 which forms an electrode 63A connected to an external detecting circuit, not shown.

A protective film 64 of an electrically insulating material is conformally deposited overall on the upper-side face of the surface layer 51B of the SOI substrate 51. The protective film 64 covers the electrically conductive films 63 and overlaps the surface film 61 and the insulator film 62 on the diaphragm portion 55. The protective film 64 has contact holes 64A for electrical connection of the electrically conductive films 63 with the external detecting circuit, each being located corresponding to the electrode 63A of the electrically conductive film 63. FIG. 28 shows merely one of the contact holes 64A corresponding to the electrode 63A for simple illustration.

The recess 56 is covered with the surface film 61, the insulator film 62 and the protective film 64 which are extremely thinned and deposited conformally on the recess 56. An outer recessed surface 56A is located on the protective film 64 and similar in shape to the recessed surface 56B.

A lid 65 is fixedly mounted to the thicker portion 58 of the diaphragm portion 55 of the SOI substrate 51 via the surface film 61, the insulator film 62 and the protective film 64. The lid 65 covers the recess 56 and the detector portion 59 within the recess 56. The lid 65 is made of such a rigid material as to reinforce the thicker portion 58. The lid 65 may be secured to the thicker portion 58 by anode coupling, as well as the lid 44 of the aforementioned second embodiment. The lid 65 and the diaphragm portion 55 cooperate to define a reference pressure chamber S between the outer recessed surface 56A and a surface of the lid 65 which is opposed to the outer recessed surface 56A.

With the provision of the inner round beveled surface 56B3 along the periphery of the bottom surface 56B1 of the recessed surface 56B, the peripheral portion of the inner round beveled surface 56B3 is flexibly deformable to reduce stress concentration on the periphery of the bottom surface 56B1, when a pressure is applied to the diaphragm portion 55. This serves for enhancing the pressure resistance of the pressure sensor.

Further, the outer round beveled surface 56B4 disposed on the open end of the recess 56 can prevent the peripheral portion of the open end of the recess 56 from suffering from stress concentration caused by an increasing pressure applied to the diaphragm portion 55. This serves for increasing the pressure resistance of the pressure sensor.

Referring to FIGS. 30–39, the method of fabricating the pressure sensor shown in FIG. 28 will be explained hereinafter. The fabrication processes are conducted in the following sequence.

Figure 30:
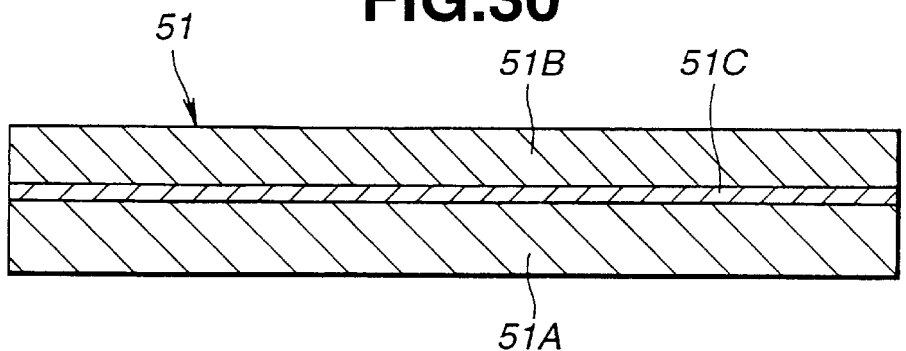
FIGS. 30–31 are cross-sections showing the process of preparing the substrate of the pressure sensor shown in FIG. 28.

As illustrated in FIG. 30, an SOI substrate 51 as explained in the aforementioned second embodiment, is provided as a starting material. The SOI substrate 51 includes a monocrystalline silicon base 51A, a surface layer of a silicon based material 51B, and an insulator film of an electrically insulating material 51C deposited between the base 51A and the surface layer 51B.

Figure 31:
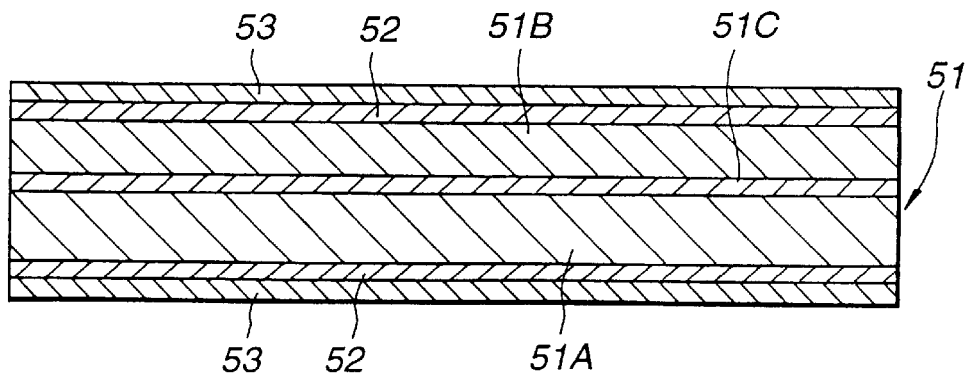

As illustrated in FIG. 31, a film of silicon dioxide 52 as a passivation film is deposited on opposed surfaces of the SOI substrate 51. A film of silicon nitride 53 as a passivation film is deposited on the silicon dioxide film 52 on each of the opposed surfaces of the SOI substrate 51.

Figure 32:
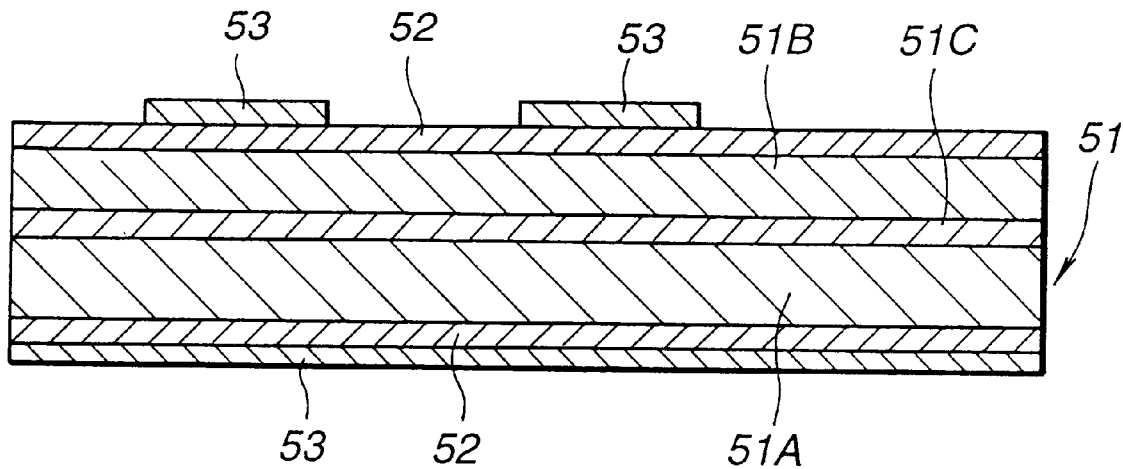
FIGS. 32–34 are cross-sections showing the process of forming a recess in the substrate shown in FIG. 31.

As shown in FIG. 32, the silicon nitride film 53 over the upper surface of the SOI substrate 51 is selectively removed by lithographical and etching techniques. The remainder of the silicon nitride film 53A covers a thicker portion 58 of a diaphragm portion 56 which is formed in the subsequent processes.

Figure 33:
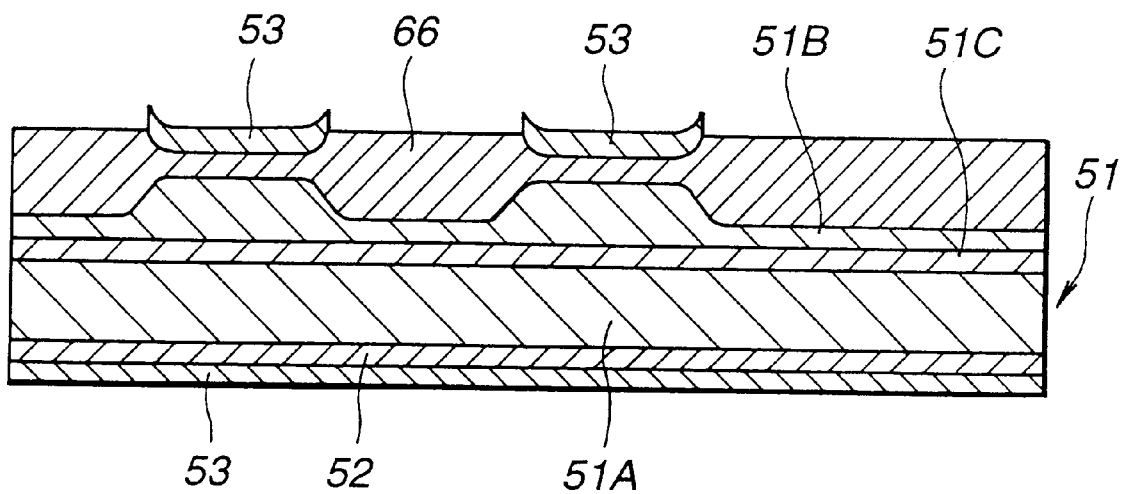

A film of silicon dioxide 66 is grown onto a portion of the surface layer 51B which is uncovered with the silicon nitride film 53, using LOCOS of the portion of the surface layer 51B in an ambient containing oxygen, as shown in FIG. 33. The grown silicon dioxide film 66 having an increased thickness is thus deposited on the upper-side face of the surface layer 51B. A portion of the surface layer 51B raised as mesa is formed behind the remainder of the silicon nitride film 53.

Figure 34:
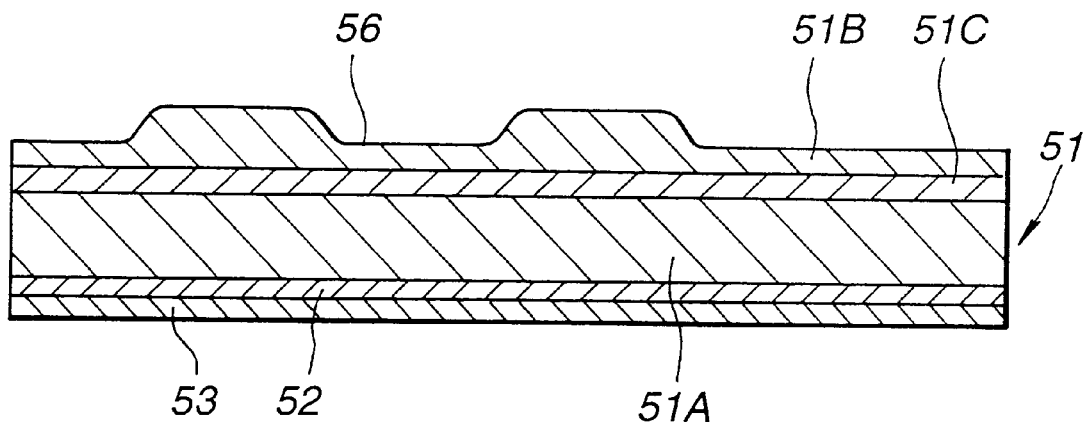

As shown in FIG. 34, the remainder of the silicon nitride film 53 and the silicon dioxide film 66 on the upper-side face of the surface layer 51B are removed to form a recess 56 within which a detector portion of a pressure sensitive arrangement is disposed at the subsequent processes.

Figure 35:
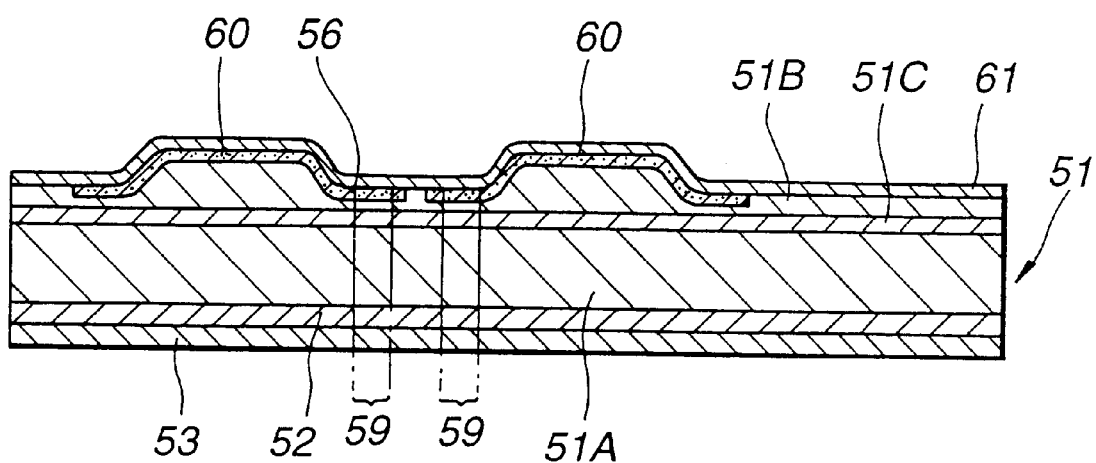
FIGS. 35–38 are cross-sections showing the process of placing a pressure sensitive arrangement in the substrate shown in FIG. 34.

A surface film of silicon dioxide 61 is conformally deposited on the upper-side face of the surface layer 51B by oxidizing the SOI substrate 51 in an ambient containing oxygen, as shown in FIG. 35. A plurality of piezoresistive elements 59 of a P-conductivity type which act as the detector portion, are formed by doping impurity, for instance, boron, into a portion of the surface layer 51B which defines the recess 56, as shown in FIG. 24. This doping process may be conducted by ion implantation. The piezoresistive elements 59 are so placed as to occupy at least a part of the recess 56, for example, the inside along a periphery of a planar bottom surface of the recess 56. In this process, diffused leads 60 are formed in predetermined regions of the surface layer 51B, substantially along the upper-side face of the surface layer 51B.

Figure 36:
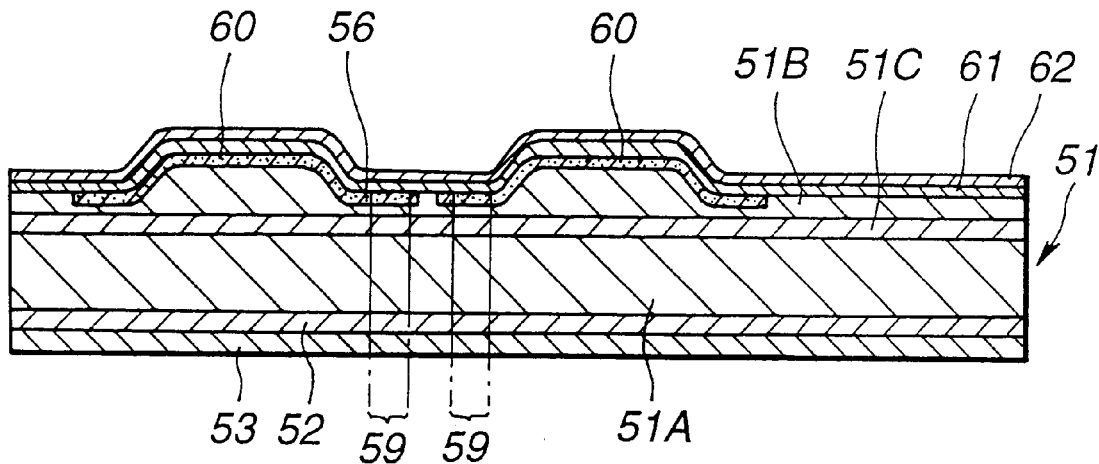

An insulator film of an electrically insulating material 62 is conformally deposited on the surface film 61 on the upper-side face of the surface layer 51B, as shown in FIG. 36.

Figure 37:
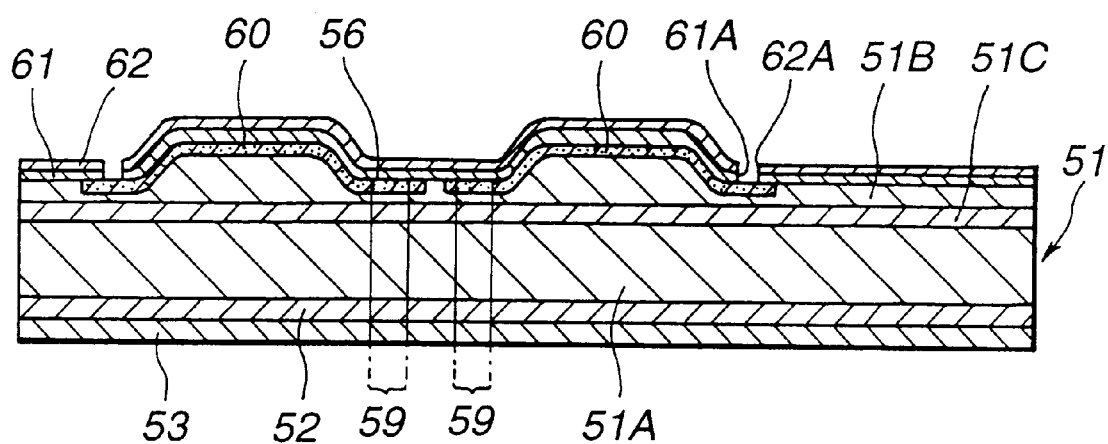

As illustrated in FIG. 37, contact holes 61A and 62A are respectively formed in the surface film 61 and the insulator film 62 for connection of the piezoresistive elements 59 and the diffused leads 60 with electrically conductive films 63 deposited in the following process.

Figure 38:
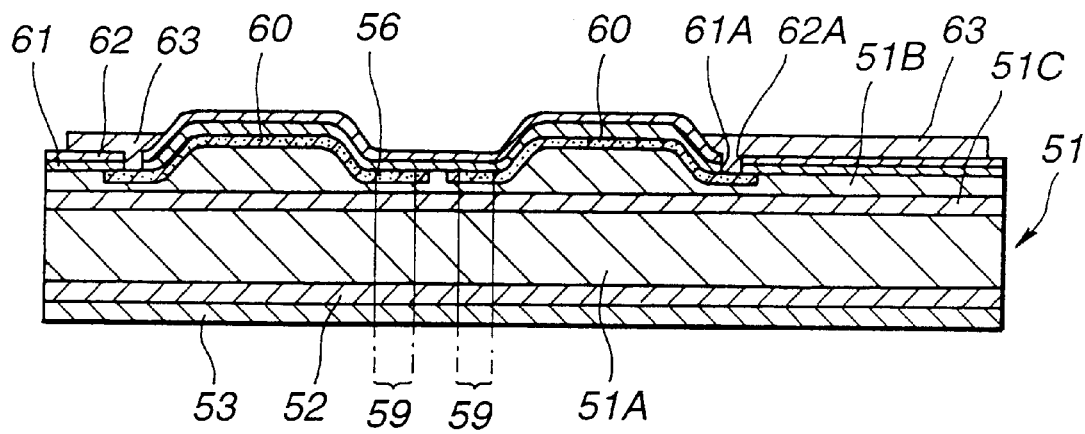

The electrically conductive films 63 may be deposited on the insulator film 62 by vacuum deposition or the like, as shown in FIG. 38.

Figure 39:
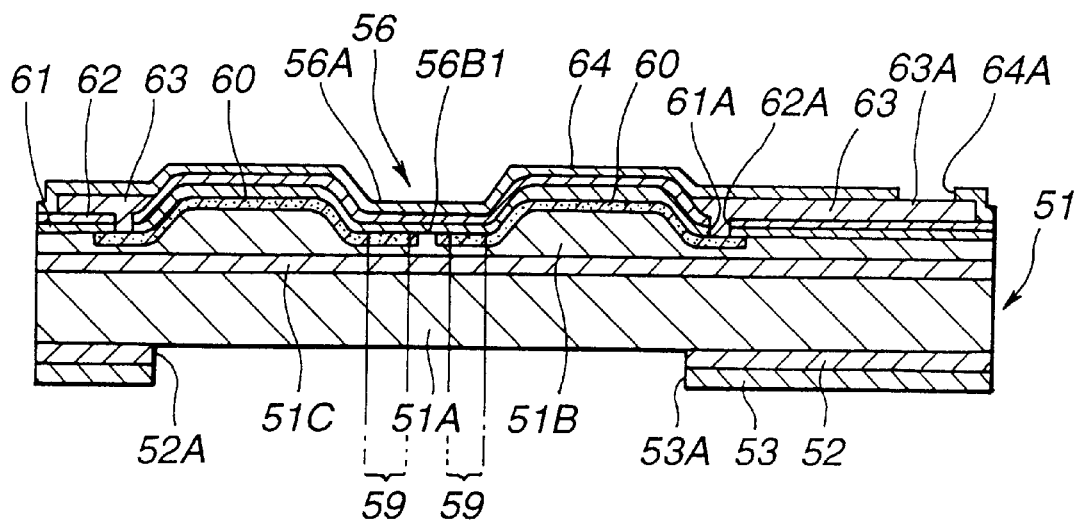
FIG. 39 is a cross-section showing the process of forming a recess in the substrate shown in FIG. 38.

A protective film 64 is conformally deposited on the entire upper-side face of the surface layer 51B, as shown in FIG. 39. The protective film 64 has a portion which overlies the surface film 61 and the insulator film 62 in the recess 56 to form an outer recessed surface 56A. A contact hole 64A is formed to define a bonding pad region corresponding to an electrode 63A of the electrically conductive film 63, in the protective film 64. Subsequently, the silicon dioxide film 52 and the silicon nitride film 53 on the lower surface of the base 51A of the SOI substrate 51 are selectively removed by lithographical and etching techniques to form apertures 52A and 53A, respectively, corresponding to a diaphragm-defining recess 54 formed in the following process.

The base 51A of the SOI substrate 51 is now removed through the apertures 52A and 53A by anisotropic etching. The anisotropic etching is stopped at an interface between the base 51A and the insulator film 51C. The diaphragm-defining recess 54 is thus formed in the base 51A as shown in FIG. 28.

A lid 65 is placed onto the upper-side face of the thicker portion 58 of the diaphragm portion 55 which is covered with the surface film 61, the insulator film 62 and the protective film 64, and then fixed thereto by a suitable manner such as anode coupling.

The third embodiment of the method for fabricating the pressure sensor uses LOCOS in the process of forming the recess 56, so that the dry etching process for forming the recess 36 as explained in the second embodiment can be omitted. This contributes to reduction of time required for fabricating the pressure sensor and thus saving the fabrication cost.

Figure 40:
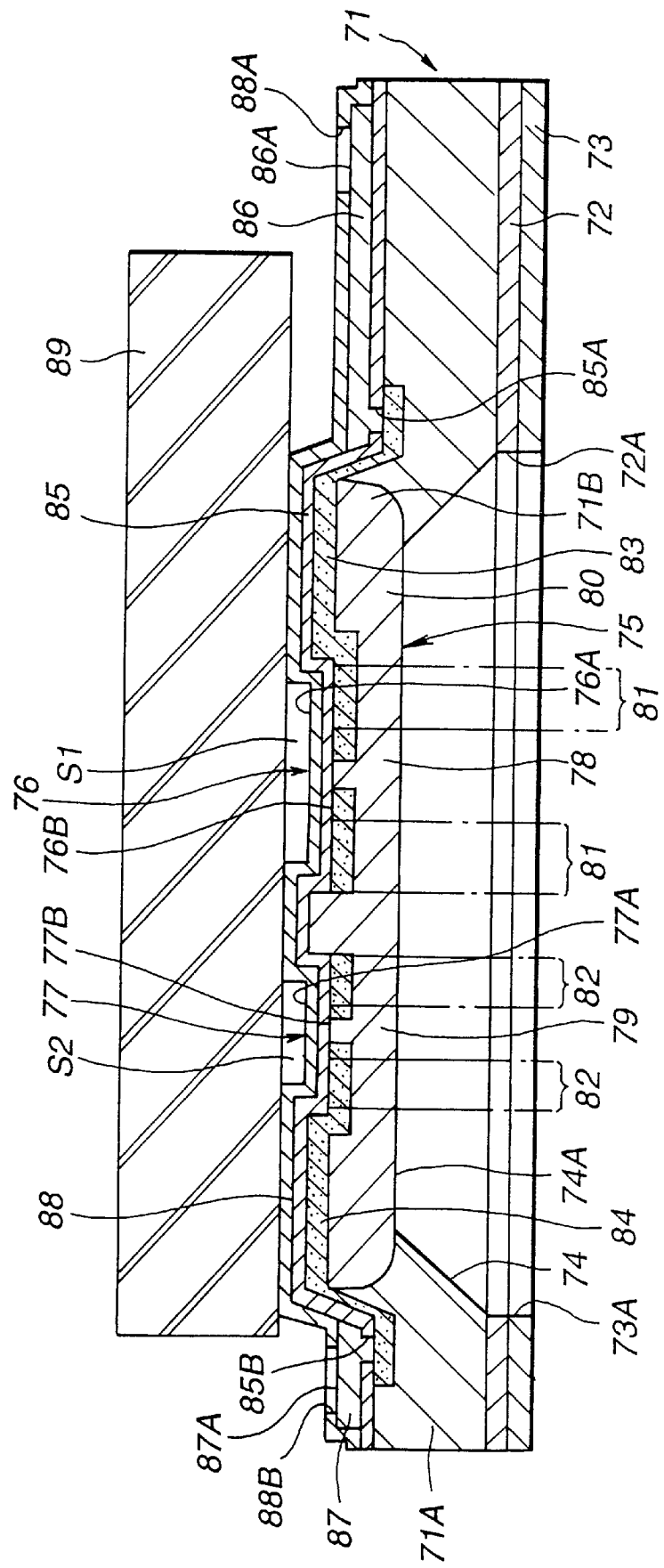
FIG. 40 is a cross-section similar to FIG. 1 but showing a pressure sensor of a fourth embodiment according to the present invention.

Referring to FIG. 40, a fourth embodiment of the pressure sensor and the method of forming the same, according to the present invention, will be explained hereinafter. This embodiment differs in formation of a plurality of recesses disposed in a diaphragm portion of a substrate and formation of a diaphragm-defining recess having a greater area than a total area of the recesses, from the aforementioned first embodiment.

As illustrated in FIG. 40, the pressure sensor includes a monocrystalline silicon substrate 71 of a generally rectangular shape. The substrate 71 includes a base 71A of a P-conductivity type and a surface layer 71B of an N-conductivity type grown onto the base 71A, similar to the substrate 11 of the first embodiment. A silicon dioxide film 72 is deposited on a lower surface of the base 71A which forms a lower surface of the substrate 71. A silicon nitride film 73 is deposited on the silicon dioxide film 72. The surface layer 71B forms a mesa portion of the substrate 71 raised outwardly, upwardly as viewed in FIG. 40, from the upper surface of the base 71A. An upper-side face of the surface layer 71B forms an upper surface of the substrate 11 in cooperation with the upper surface of the base 71A.

A diaphragm-defining recess 74 is formed in the base 71A of the substrate 71. The recess 74 is recessed inwardly from the lower surface of the base 71A to define the diaphragm portion 75 between a planar rectangular-shaped bottom surface 74A of the recess 74 and the upper-side face of the surface layer 71B. The recess 74 extends through the base 71A to be opposed to a rearside face of the surface layer 71B. The recess 74 is formed by an etching technique through apertures 72A and 73A of the silicon dioxide film 72 and the silicon nitride film 73.

The diaphragm portion 75 is disposed in the surface layer 71B and defined by the rectangular shaped bottom surface 74A of the recess 74. The diaphragm portion 75 has a predetermined width and a predetermined thickness, as well as the diaphragm portion 15 of the aforementioned first embodiment.

A plurality of recesses, for instance, two, 76 and 77 are disposed within the diaphragm portion 75. The recesses 76 and 77 are recessed inwardly from the upper-side face of the surface layer 71B to define thinned portions 78 and 79 of the diaphragm portion 75 between planar bottom surfaces of the recesses 76 and 77 and the bottom surface 74A of the recess 74. The diaphragm portion 75 has a thicker portion 80 surrounding the thinned portions 78 and 79 and the recesses 76 and 77.

The recesses 76 and 77 have a generally rectangular shallow groove-like shape, as well as the recess 16 of the aforementioned first embodiment. The recesses 76 and 77 are defined by recessed surfaces 76B and 77B respectively formed in the surface layer 71B where the diaphragm portion 75 is disposed. The recessed surfaces 76B and 77B include the planar bottom surfaces of generally rectangular shapes, respectively. The bottom surfaces of the recesses 76 and 77 have a total area smaller than an area of the bottom surface 74A of the recess 74. The bottom surface of the recessed surface 76B has a larger area than the bottom surface of the recessed surface 77B.

Each of the thinned portions 78 and 79 of the diaphragm portion 75 has a predetermined width and a predetermined thickness. The thinned portions 78 and 79 are flexible in response to a pressure applied to the diaphragm portion 75. The thicker portion 80 extends along a rectangular periphery of each of the thinned portions 78 and 79 and has a generally rectangular frame-like shape. The thicker portion 80 has a predetermined width, for instance, of approximately 10–30 μm.

Disposed within the recess 76 are a plurality of piezoresistive elements 81 as a detector portion of a pressure sensitive arrangement. In this embodiment, four piezoresistive elements 81 are placed inside along the periphery of the bottom surface of the recess 76. FIG. 40 shows two of the four piezoresistive elements 81. Each of the piezoresistive elements 81 is of a P-conductivity type, similar to the piezoresistive elements 19 of the aforementioned first embodiment.

A plurality of piezoresistive elements 82 as the detector portion are disposed within the recess 77. For instance, four piezoresistive elements 82 may be placed inside along the periphery of the bottom surface of the recess 77. FIG. 40 shows two of the four piezoresistive elements 82. Each of the piezoresistive elements 82 is of a P-conductivity type, as well as each piezoresistive element 81.

Diffused leads 83 are disposed on predetermined portions of the substrate 71. The diffused leads 83 are formed by doping impurity into portions of the surface layer 71B. Each of the diffused leads 83 has one end portion disposed within the recess 76 of the diaphragm portion 75 and an opposite end portion extending outside the recess 76, as well as the diffused leads 20 of the aforementioned first embodiment. The one end portion of the diffused lead 83 is connected with each piezoresistive element 81 and the opposite end portion thereof is connected with an electrically conductive film 86 as explained later.

Diffused leads 84 are disposed on predetermined portions of the substrate 71. The diffused leads 84 are formed by doping impurity into portions of the surface layer 71B. Each of the diffused leads 84 has one end portion disposed within the recess 77 of the diaphragm portion 75 and an opposite end portion extending outside the recess 77, as well as the diffused leads 83. The one end portion of the diffused lead 84 is connected with each piezoresistive element 82 and the opposite end portion thereof is connected with an electrically conductive film 87 as explained later.

An insulator film 85 of an electrically insulating material, for instance silicon dioxide, is deposited on the upper surface of the substrate 71. The insulator film 85 is conformally deposited on the recesses 76 and 77 to cover the piezoresistive elements 81 and 82 and the diffused leads 83 and 84. The insulator film 85 also covers the upper-side face of the surface layer 71B around the recesses 76 and 77 and the upper surface of the base 71A connected with the upper-side face thereof via an inclined surface therebetween. The insulator film 85 has a thickness of approximately 0.3–0.9 μm. The insulator film 85 has contact holes 85A and 85B, each being positioned corresponding to the opposite end portion of each of the diffused leads 83 and 84.

The electrically conductive films 86 and 87 are deposited on the upper surface of the substrate 71 through the insulator film 85. The electrically conductive films 86 and 87 may be made of metals such as aluminum. Each of the electrically conductive films 86 and 87 has one end portion connected with the corresponding diffused lead 83 and 84 through the corresponding contact hole 85A and 85B of the insulator film 85. The other end of each electrically conductive film 86 and 87 is located outside the diaphragm portion 75 and forms an electrode 86A and 87A connected to an external detecting circuit.

A protective film 88 of an electrically insulating material is conformally deposited overall the upper surface of the substrate 71 to cover the electrically conductive films 86 and 87. The protective film 88 has contact holes 88A and 88B for electrical connection of the electrically conductive films 86 and 87 with the external detecting circuit, each being located corresponding to the electrodes 86A and 87A.

The insulator film 85 and the protective film 88 are extremely thinned and conformally deposited on the recesses 76 and 77. Outer recessed surfaces 76A and 77A are formed atop the protective film 88 in the recesses 76 and 77. The outer recessed surfaces 76A and 77A are similar in shape to the recessed surfaces 76B and 77B.

A lid 89 is fixed to the thicker portion 80 of the diaphragm portion 75 of the substrate 71 via the insulator film 85 and the protective film 88, covering the recesses 76 and 77 and the piezoresistive elements 81 and 82 within the recesses 76 and 77. The lid 89 is made of a suitable material having a predetermined rigidity to reinforce the thicker portion 18 and secured onto the upper side of the thicker portion 80 by anode coupling, as well as the lid 24 of the aforementioned first embodiment. The lid 89 cooperates with the diaphragm portion 75 to define a reference pressure chamber S1 between the outer recessed surface 76A of the recess 76 and a surface of the lid 89 opposed thereto and a reference pressure chamber S2 between the outer recessed surface 77A of the recess 77 and the opposed surface of the lid 89.

The pressure sensor of the fourth embodiment can exhibit substantially same function and effects as those of the pressure sensor of the aforementioned first embodiment.

Further, with the arrangement of the two recesses 76 and 77 opposed to the diaphragm-defining recess 74, the two thinned portions 78 and 79 flexibly deformable in response to a pressure applied to the diaphragm portion 75 are formed in the substrate 71. Therefore, the respective piezoresistive elements 81 and 82 disposed at the two thinned portions 78 and 79 can accurately detect the pressure applied to the diaphragm portion 75.

Furthermore, since the bottom surfaces of the recessed surfaces 76B and 77B of the recesses 76 and 77 have different areas from each other, it is possible to detect the pressure within different ranges at the thinned portions 78 and 79 corresponding to the bottom surfaces of the recessed surfaces 76B and 77B. Namely, a lower pressure can be detected at the thinned portion 78 corresponding to the larger bottom surface of the recessed surface 76B, while a higher pressure can be detected at the thinned portion 79 corresponding to the smaller bottom surface of the recessed surface 77. With the arrangement of the two thinned portions 78 and 79, the pressure sensor can detect the pressure applied thereto within a greater range.

The fourth embodiment of the pressure sensor is formed by the method similar to the method as explained in the first embodiment, except the following processes. In the process of forming the recesses 76 and 77, the surface layer 71B is etched to form the recesses 76 and 77 such that the bottom surface of the recessed surface 76B has the area greater than the area of the bottom surface of the recessed surface 77B. In the process of forming the diaphragm-defining recess 74, the base 71A is anisotropically etched to form the recess 74 such that the bottom surface 74A of the recess 74 has the area greater than the total area of the bottom surfaces of recessed surfaces 76B and 77B of the recesses 76 and 77.

Figure 41:
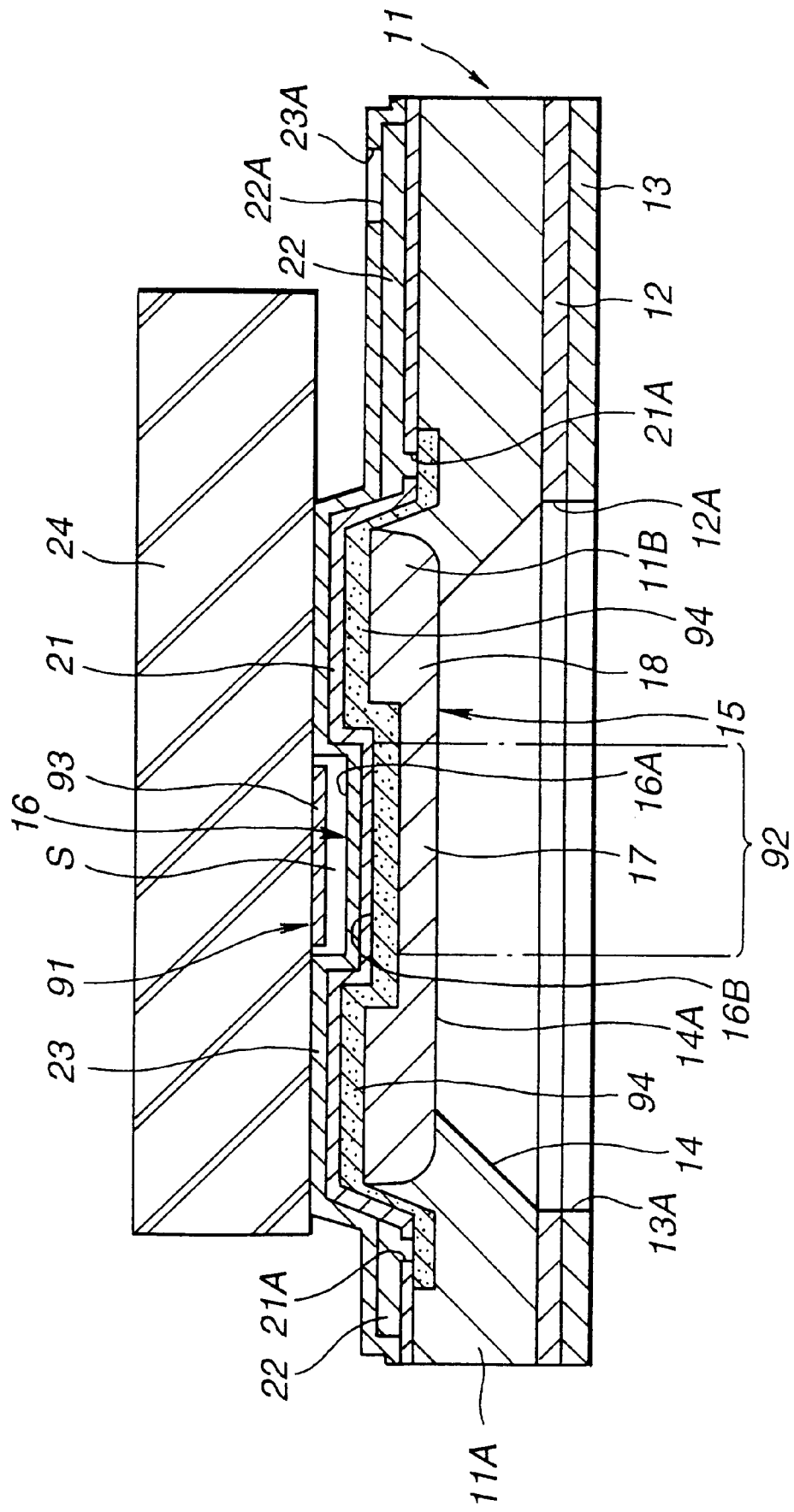
FIG. 41 is a cross-section similar to FIG. 1 but showing a pressure sensor of a fifth embodiment according to the present invention.

Referring now to FIG. 41, a fifth embodiment of the pressure sensor and the method for forming the same, according to the present invention, is explained. This embodiment differs in use of a capacitive element as the detector portion of the pressure sensitive arrangement, from the aforementioned first embodiment. Like reference numerals and characters denote like parts and therefore detailed explanations therefor are omitted.

As illustrated in FIG. 41, the capacitive element 91 includes a first electrode 92 placed within the recess 16 and a second electrode 93 fixed to the lower surface of the lid 24 in opposed relation to the first electrode 92. The first electrode 92 is formed by doping impurity such as boron into a portion of the surface layer 11B which defines the recess 16. This doping process may be conducted using ion implantation. The first electrode 92 is so disposed as to occupy the entire bottom surface of the recessed surface 16B. The first electrode 92 is formed together with diffused leads 94 similar to the diffused leads 20 of the aforementioned first embodiment. Each of the diffused leads 94 has one end portion located within the recess 16 and an opposite end portion extending outward the recess 16. The one end portion of the diffused lead 94 is connected with the first electrode 92 and the opposite end portion is connected with the electrically conductive film 22.

The second electrode 93 may be made of an electrically conductive material and formed by vacuum deposition. The second electrode 93 is secured to the lower surface of the lid 24 prior to fixing the lid 24 to the substrate 11. The second electrode 93 has substantially same area as an area of the first electrode 92. The second electrode 93 is placed over the bottom surface of the recessed surface 16B. The first and second electrodes 92 and 93 are connected to an external detecting circuit, not shown.

Since the thinned portion 17 of the diaphragm portion 15 is flexibly deformed by a pressure applied to the diaphragm portion 15, a distance between the thinned portion 17 and the lid 24 varies depending on the pressure applied. Capacitance between the first and second electrodes 92 and 93 varies depending on the distance between the thinned portion 17 and the lid 24. The pressure applied to the diaphragm portion 15 can be detected by determining the electrostatic capacitance between the first and second electrodes 92 and 93.

The fifth embodiment of the pressure sensor is formed by the method similar to the method as explained in the first embodiment, except the following processes. In the process of placing the capacitive element 91 as the detector portion, the portion of the surface layer 11B which defines the recess 16 is doped with impurity, for instance, using ion implantation to form the first electrode 92 acting as the detector portion. Prior to the process of fixing the lid 24 to the substrate 11, a film of an electrically conductive material is deposited on the lower surface of the lid 24 in opposed relation to the first electrode 92 to form the second electrode 93 which cooperates with the first electrode 92 to form the capacitive element 91. This process of depositing the electrically conductive film may be conducted by vacuum deposition.

The pressure sensor of the fifth embodiment can exhibit substantially same function and effects as those of the pressure sensors of the first and second embodiments.

Figure 42:
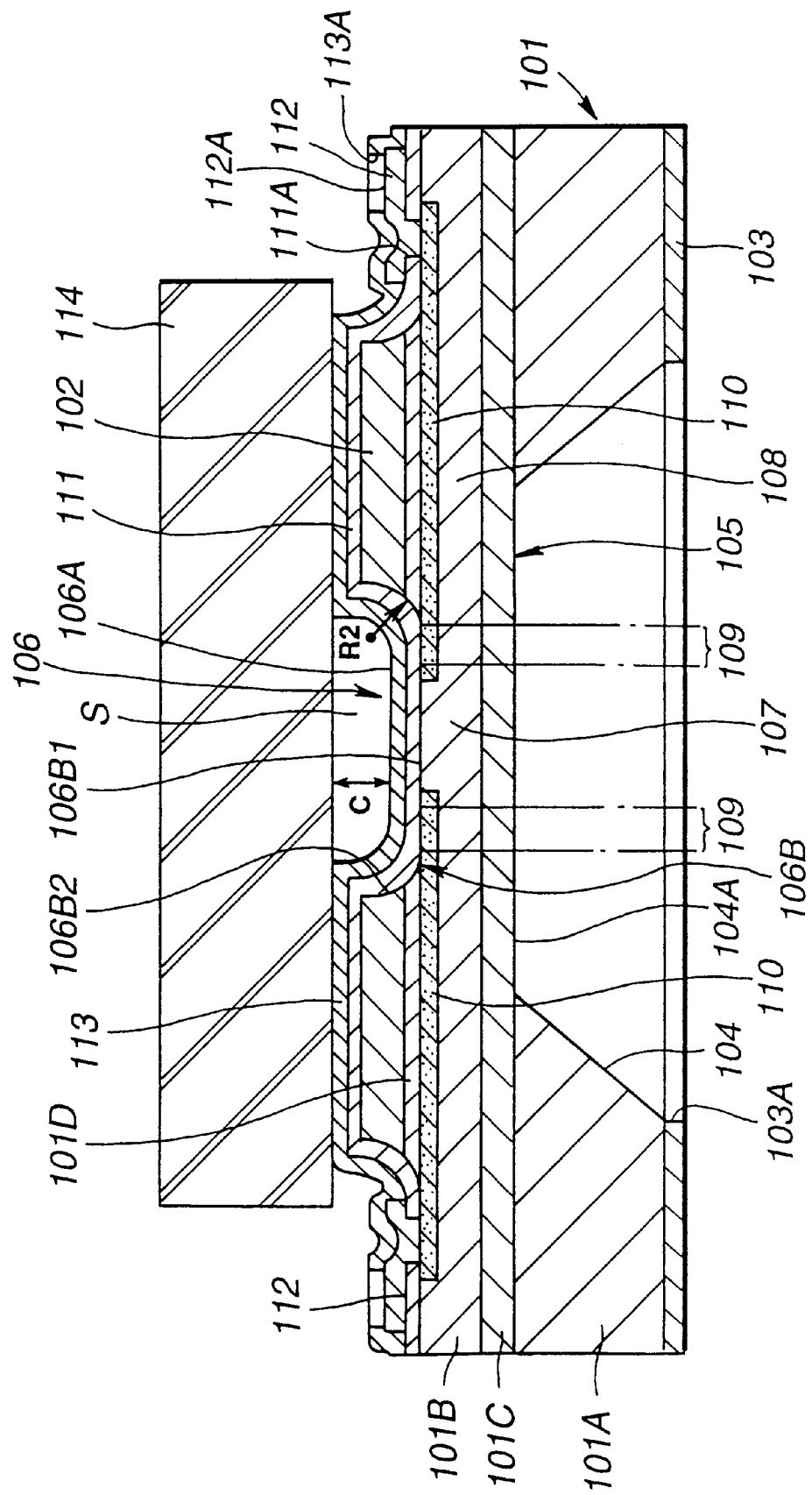
FIG. 42 is a cross-section similar to FIG. 1 but showing a pressure sensor of a sixth embodiment according to the present invention.
Figure 43:
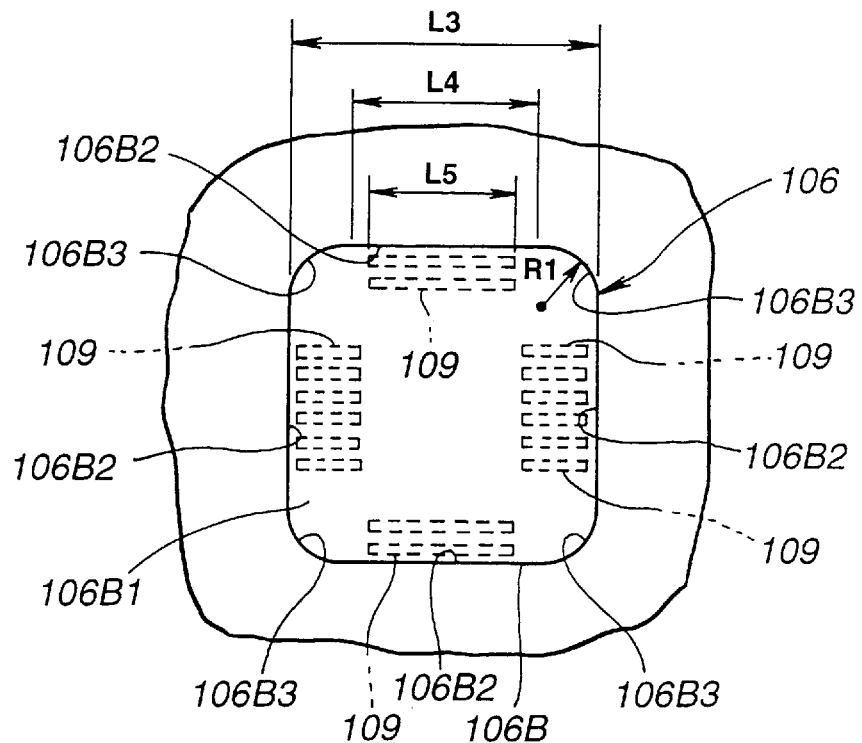
FIG. 43 is a fragmentary plan view of FIG. 42, showing a recess within which a detector portion of a pressure sensitive arrangement is disposed.

Referring to FIGS. 42 and 43, a sixth embodiment of the pressure sensor and the method of forming the same, according to the present invention, will be explained hereinafter. This embodiment differs from the aforementioned second embodiment in that a substrate of the pressure sensor includes a film of phosphosilicate glass (PSG) deposited on the SOI substrate, and that the recessed surface defining the recess within the diaphragm portion of the substrate includes a round beveled surface.

As illustrated in FIG. 42, the pressure sensor comprises the substrate 101 including the SOI substrate which has substantially the same structure as the SOI substrate 31 of the aforementioned second embodiment, and the PSG film 102 on the SOI substrate. Similar to the SOI substrate 31 of the second embodiment, the SOI substrate has a generally rectangular shape and includes a monocrystalline silicon base 101A, a surface layer of a silicon based material 101B and an insulator film 101C between the base 101A and the surface layer 101B. The PSG film 102 is deposited on an insulator film 101D such as a silicon dioxide film, which is deposited on an upper-side face of the surface layer 101B. A silicon dioxide film 103 is deposited on a rearside surface of the base 101A.

A diaphragm-defining recess 104 is substantially centered on the base 101A. The recess 104 is recessed inwardly from a rearside surface of the base 101A to define a diaphragm portion 105 of the substrate 101 between a generally rectangular-shaped planar bottom surface 104A of the recess 104 and an upper-side face of the PSG film 102. The recess 104 extends through base 101A to be open to an upper-side surface of the base 101A. The recess 104 is opposed to a rearside surface of the insulator film 101C. The recess 104 may be formed by etching the base 101A through an aperture 103A formed in the silicon dioxide film 103.

The diaphragm portion 105 is defined by the bottom surface 104A of the recess 104. The diaphragm portion 105 has a width corresponding to the bottom surface 104A and a predetermined thickness, as well as the diaphragm portion 35 of the aforementioned second embodiment. The diaphragm portion 105 has a thinned portion 107 defined by a recess 106 as explained later, and a thicker portion 108 disposed around the thinned portion 107 and the recess 106.

The recess 106 is disposed within the diaphragm portion 105 and formed into a generally rectangular-shaped groove. The recess 106 is recessed inwardly from the upper-side face of the PSG film 102 of the substrate 101. The recess 106 may be formed by isotropic etching, for instance, wet etching.

The recess 106 is defined by a recessed surface 106B formed in the PSG film 102 and the silicon dioxide film 101D. The recessed surface 106B includes a generally rectangular-shaped planar bottom surface 106B1, round beveled surfaces 106B3 connected with four corners of the bottom surface 106B1, and a peripheral side surface 106B2 inclined relative to the bottom surface 106B1 and terminated at an open end of the recess 106. A round beveled portion may be formed on the open end of the recess 106.

The bottom surface 106B1 has a predetermined length L3 which is a length of line segments substantially constituting the generally rectangular shape of the bottom surface 106B1. The bottom surface 106B1 has a smaller area than that of the bottom surface 104A of the recess 104, as well as the aforementioned second embodiment.

The round beveled surfaces 106B3 serve for reducing stress concentration occurring at near the respective corners of the bottom surface 106B1. Each of the round beveled surfaces 106B3 has an arcuate-shaped vertical section and smoothly connected with the bottom surface 106B1. The round beveled surface 106B3 has a predetermined radius of curvature R1, for example, of approximately 8–30% and preferably of approximately 10% of the length L3 of the bottom surface 106B1.

The peripheral side surface 106B2 includes four side surface portions connected with rectilinear peripheries alternately disposed with the corners of the rectangular-shaped bottom surface 106B1. Each of the side surface portions of the peripheral side surface 106B2 includes a beveled portion connected with the rectilinear periphery of the bottom surface 106B1, and a curved portion smoothly connected with the beveled portion and extending upwardly to terminate at the open end of the recess 106. The beveled portion and the curved portion cooperate to form an arcuate-shaped vertical section of the peripheral side surface 106B2. The arcuate-shaped vertical section of the peripheral side surface 106B2 has a predetermined radius of curvature R2 as shown in FIG. 42. In the case of fabricating a pressure sensor for detecting high pressure, the radius of curvature R2 may be of a relatively large value. This serves for reducing the stress caused in the peripheral portion of the bottom surface 106B1 due to the high pressure applied to the diaphragm portion 105. On the other hand, in the case of fabricating a pressure sensor for detecting low pressure, the radius of curvature R2 may be of a relatively small value. In this case, an opening area of the recess 106 and a dimension of the whole pressure sensor may be reduced. As shown in FIG. 43, the side surface portions of the peripheral side surface 106B2 have a predetermined length L4. The length L4 may be of approximately 40–84% of the length L3.

The thinned portion 107 of the diaphragm portion 105 extends between the bottom surface 106B1 of the recess 106 and the bottom surface 104A of the recess 104. Thus, the thinned portion 107 includes the surface layer 101B and the insulator film 101C which are disposed between the bottom surface 106B1 and the bottom surface 104A. The thinned portion 107 is flexibly deformable in response to a pressure applied to the diaphragm portion 105, as well as the thinned portion 37 of the aforementioned second embodiment.

The thicker portion 108 of the diaphragm portion 105 has a generally rectangular frame-like shape having a predetermined width, for example, of approximately 100–300 μm. The thicker portion 108 includes the surface layer 101B, the insulator film 101C, the silicon dioxide film 101D and the PSG film 102 which are disposed between an upper-side face of the diaphragm portion 105 and the bottom surface 104A of the recess 104.

A plurality of piezoresistive elements 109 as a detector portion of a pressure sensitive arrangement are disposed within the recess 106, which detect flexure generated in the thinned portion 107 of the diaphragm portion 105. In this embodiment, sixteen piezoresistive elements 109 are placed inside along the periphery of the bottom surface 106B1 of the recessed surface 106B, as shown in FIG. 43. The piezoresistive elements 109 has a predetermined length L5. Each of the piezoresistive elements 109 is formed by doping impurity such as boron into the surface layer 101B of the substrate 101 and then being configured to a generally elongated rectangular shape.

Diffused leads 110 are disposed on predetermined portions of the surface layer 101B of the substrate 101. The diffused leads 110 are formed by doping impurity into the predetermined portions of the surface layer 101B. Similar to the diffused lead 40 of the aforementioned second embodiment, each of the diffused leads 110 has one end portion disposed within the recess 106 and connected with each piezoresistive element 109, and an opposite end portion extending outside the recess 106 and connected with an electrically conductive film 112 as explained later.

An insulator film 111 of an electrically insulating material is deposited on an entire upper surface of the substrate 101. The insulator film 111 may be made of silicon dioxide. The insulator film 111 is conformally deposited on the recess 106 to cover the piezoresistive elements 109 and the diffused leads 110, as well as the insulator film 41 of the aforementioned second embodiment. The insulator film 111 has contact holes 111A each positioned corresponding to the opposite end portion of the diffused lead 110.

The electrically conductive films 112 are deposited on predetermined regions of the upper-side face of the surface layer 101B through the silicon dioxide film 101D. Each of the electrically conductive film 112 may be made of metals. Similar to the electrically conductive film 42 of the aforementioned second embodiment, the electrically conductive film 112 has one end portion connected with the diffused lead 110 through the contact hole 111A of the insulator film 111. The electrically conductive film 112 has the other end outside the diaphragm portion 105 which forms an electrode 112A connected to an external detecting circuit, not shown.

A protective film 113 of an electrically insulating material is conformally deposited overall on the upper surface of the substrate 101. The protective film 113 has contact holes 113A located corresponding to the electrode 112A for electrical connection of the electrically conductive films 112 with the external detecting circuit, as well as the protective film 43 of the aforementioned second embodiment.

The recess 106 is covered with the insulator film 111 and the protective film 113 which are extremely thinned and conformally deposited on the recess 106. An outer recessed surface 106A similar in shape to the recessed surface 106B is located on the protective film 113.

A lid 114 is fixedly mounted to the thicker portion 108 of the diaphragm portion 105 of the substrate 101 via the insulator film 111 and the protective film 113, as well as the lid 44 of the aforementioned second embodiment. Similar to the lid 44 of the second embodiment, the lid 114 is made of such a rigid material as to reinforce the thicker portion 108. The lid 114 and the diaphragm portion 105 cooperate to define a reference pressure chamber S between the outer recessed surface 106A of the recess 106 and a rearside surface of the lid 114 which is opposed to the recess 106.

A clearance C between the outer recessed surface 106A and the lower surface of the lid 114 may be large in the case of the pressure sensor for detecting high pressure and be small in the case of the pressure sensor for detecting low pressure.

The pressure sensor of the sixth embodiment is formed by the method similar to the method as explained in the second embodiment, except the following processes. In the process of preparing the substrate 101, the silicon dioxide film 101D is deposited on the upper-side face of the surface layer 101B and then the PSG film 102 is deposited on the silicon dioxide film 101D. In the process of forming the recess 106, the PSG film 102 is isotropically etched, for instance, using wet etching, to form the round beveled surface 106B3 having the radius of curvature R1 and the peripheral side surface 106B2 having the radius of curvature R2.

The pressure sensor of the sixth embodiment can exhibit substantially same function and effects as those of the pressure sensors of the aforementioned first though fifth embodiments. In addition, with the arrangement of the round beveled surface 106B3 at the corners of the bottom surface 106B1, the recessed surface 106B can be prevented from being subject to the stress concentration on the corners.

Further, since the recess 106 is formed using isotropic etching, the peripheral side surface 106B2 having a large radius of curvature R2 can be formed if the depth of the recess 106 is increased. Conversely, the peripheral side surface 106B2 having a small radius of curvature R2 can be formed if the depth of the recess 106 is reduced. Accordingly, the radius of curvature R2 can be variably determined to prevent the recessed surface 106B from suffering stress concentration on the peripheral portion of the bottom surface 106B1 due to the pressure applied to the diaphragm portion 105.

Furthermore, with the predetermined length L4 of the side surface portions of the peripheral side surface 106B2, namely, approximately 40–84% of the length L3 of the bottom surface 106B1, the bottom surface 106B1 is flexible evenly at the periphery near the peripheral side surface 106B2 when the thinned portion 107 of the diaphragm portion 105 is flexibly deformed by the pressure applied thereto.

Therefore, the piezoresistive elements 109 disposed at the periphery of the bottom surface 106B1 can detect the even flexure generated at the periphery of the bottom surface 106B1. This allows an improvement in accuracy of the detection of the pressure sensor.

Further, the peripheral side surface 106B2 having the arcuate-shaped vertical section is slightly flexibly deformable overall when the thinned portion 107 of the diaphragm portion 105 is flexibly deformed due to the pressure applied thereto. Owing to the curvature of the peripheral side surface 106B2, the stress acting on the beveled portion of the peripheral side surface 106B2 via the bottom surface 106B1 can be dispersed even though a higher pressure is applied to the diaphragm portion 105. This enhances a pressure resistance of the pressure sensor.

In this embodiment, a relationship between the length L3 of the bottom surface 106B1, the radius of curvature R1 of the round beveled surface 106B3, i.e., 8–30% of the length L3, and the length L5 of the piezoresistive element 109 can be represented by the following equation (1).

$$L3 \geq 2 \times R1 + L5 \tag{1}$$

When the length L3 is equal to a total value of the length L5 and twice the radius of curvature R1 in the equation (1), the length L5 can be approximated to the length L4. In such a case, the dimension of the pressure sensor can be reduced.

Figure 44:
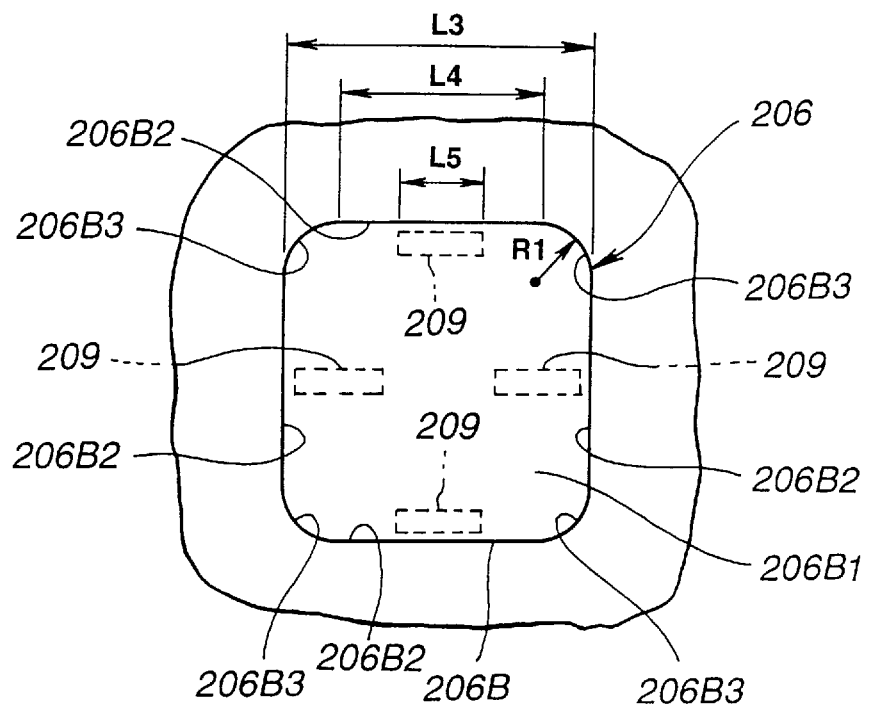
FIG. 44 is a view similar to FIG. 43 but showing a modification of the sixth embodiment.

FIG. 44 illustrates a modification of the sixth embodiment shown in FIG. 43, in which reference numerals 206 and 206B denote a recess and a recessed surface, respectively, similar to the recess 106 and the recessed surface 106B shown in FIG. 43. In FIG. 44, the recessed surface 206B includes a generally rectangular-shaped planar bottom surface 206B1, a peripheral side surface 206B2 and a round beveled surface 206B3, as well as the recessed surface 106B of the sixth embodiment. Four piezoresistive elements 209 are disposed within the recess 206. In this modification, the length L4 of the side surface portions of the peripheral side surface 206B2 is not less than twice the length L5 of the piezoresistive elements 209. This arrangement permits flexible deformation to be generated largely and evenly at a longitudinal-middle portion of each side surface portion of the peripheral side surface 206B2. The piezoresistive element 209 located at the side surface portion can detect the large even flexible deformation, so that the detection of pressure may be conducted with an increased accuracy.

Figure 45:
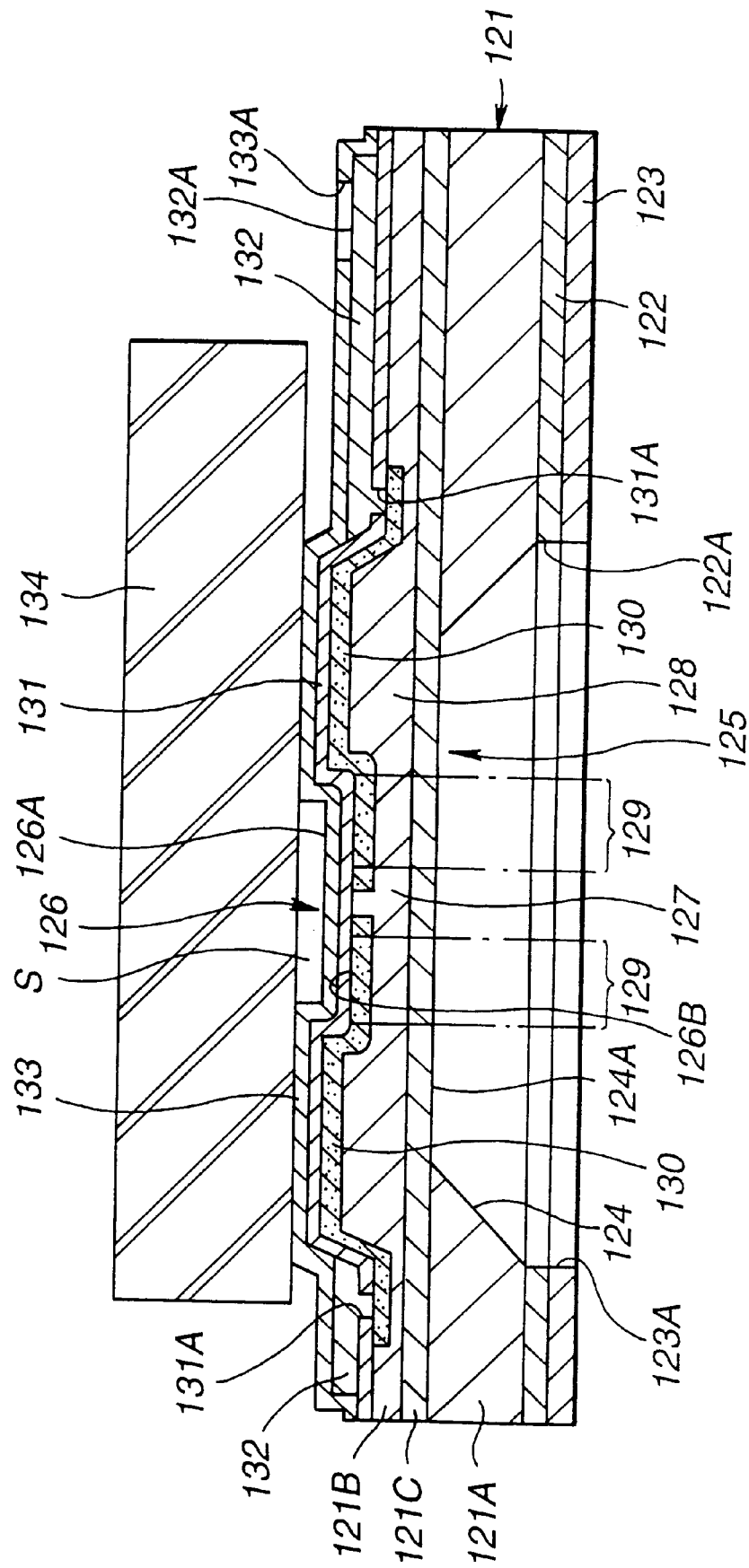
FIG. 45 is a cross-section similar to FIG. 1 but showing a pressure sensor of a seventh embodiment according to the present invention.
Figure 46:
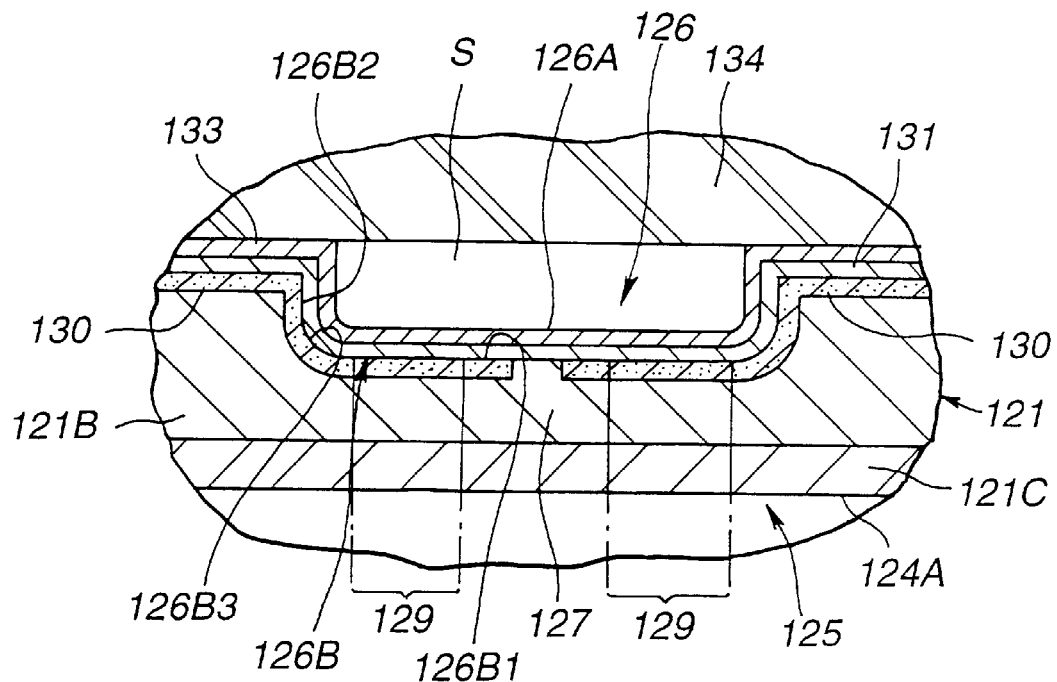
FIG. 46 is an enlarged fragmentary view of FIG. 45, showing a recess formed in a diaphragm portion of a substrate of the pressure sensor.

Referring now to FIGS. 45 and 46, a seventh embodiment of the pressure sensor and the method of forming the same, according to the present invention, is explained hereinafter. This embodiment differs from the aforementioned second embodiment in configuration of the recess disposed within the diaphragm portion of the substrate.

As illustrated in FIG. 45, the pressure sensor includes an SOI substrate 121 similar to the SOI substrate 31 of the aforementioned second embodiment. The SOI substrate 121 has a generally rectangular shape and includes a base 121A made of single crystal silicon, an insulator film 121C of an electrically insulating material such as silicon dioxide, deposited on the base 121A, and a surface layer 121B of a silicon based material, for example, polysilicon, deposited on the insulator film 121C. Deposited on a rearside surface of the base 121A is a silicon dioxide film 122 on which a silicon nitride film 123 is deposited.

A diaphragm-defining recess 124 is formed in the base 121A of the SOI substrate 121. The recess 124 is recessed inwardly from the rearside surface of the base 121A to define a diaphragm portion 125 of the SOI substrate 121 between a generally rectangular-shaped planar bottom surface 124A of the recess 124 and an upper-side face of the surface layer 121B. The recess 124 extends through base 121A to be open to an upper-side surface of the base 121A. The recess 124 is opposed to a rearside surface of the insulator film 121C. The recess 124 may be formed by etching the base 121A through apertures 122A and 123A which are formed in the silicon dioxide film 122 and the silicon dioxide film 123, respectively.

The diaphragm portion 125 is defined by the bottom surface 124A of the recess 124. The diaphragm portion 125 has a width corresponding to the bottom surface 124A and a predetermined thickness, as well as the diaphragm portion 35 of the aforementioned second embodiment. The diaphragm portion 125 has a thinned portion 127 defined by a recess 126 as explained later, and a thicker portion 128 disposed around the thinned portion 127 and the recess 126.

The recess 126 is disposed within the diaphragm portion 125 and formed into a generally rectangular-shaped groove. The recess 126 is recessed inwardly from the upper-side face of the surface layer 121B of the SOI substrate 121. The recess 126 may be formed by etching, for instance, combination of anisotropic dry etching and isotropic wet etching, or selective wet etching using difference in concentration of an impurity atom. The recess 126 is defined by a recessed surface 126B formed in the surface layer 121B. The recessed surface 126B includes a planar bottom surface 126B1 of a generally rectangular shape, four planar side surfaces 126B2 substantially perpendicular to the bottom surface 126B1, and a round beveled surface 126B3 interposed between the bottom surface 126B1 and the side surfaces 126B2. The side surfaces 126B2 are circumferentially connected with each other to form an integral peripheral side surface. The round beveled surface 126B3 is connected with the periphery of the generally rectangular-shaped bottom surface 126B1. The round beveled surface 126B3 has an arcuate-shaped vertical section as shown in FIG. 46. Thus configured recessed surface 126B can be prevented from stress concentration on four corners of the bottom surface 126B1 and corner portions at which the adjacent two of the side surfaces 126B2 encounter with each other. The bottom surface 126B1 has a smaller area than that of the bottom surface 124A of the recess 124.

The thinned portion 127 of the diaphragm portion 125 extends between the bottom surface 126B1 of the recessed surface 126B and the bottom surface 124A of the recess 124. The thinned portion 127 includes the surface layer 121B and the insulator film 121C which are disposed between the bottom surface 126B1 of the recessed surface 126B and the bottom surface 124A of the recess 124. The thinned portion 127 has the predetermined width and thickness and is flexibly deformable in response to a pressure applied to the diaphragm portion 125, as well as the thinned portion 37 of the aforementioned second embodiment.

The thicker portion 128 of the diaphragm portion 125 has a generally rectangular frame-like shape having a predetermined width. The thicker portion 128 includes the surface layer 121B and the insulator film 121C which are disposed between an upper-side face of the diaphragm portion 125 and the bottom surface 124A of the recess 124.

A plurality of piezoresistive elements 129 as a detector portion of a pressure sensitive arrangement are disposed within the recess 126, as well as the piezoresistive element 39 of the aforementioned second embodiment. The piezoresistive elements 129 detect flexure generated in the thinned portion 127 of the diaphragm portion 125.

Diffused leads 130 are disposed on predetermined portions of the surface layer 121B of the SOI substrate 121. The diffused leads 130 are formed by doping impurity into the predetermined portions of the surface layer 121B. Similar to the diffused lead 40 of the aforementioned second embodiment, each of the diffused leads 130 has one end portion disposed within the recess 126 and an opposite end portion extending outside the recess 126. The one end portion of the diffused lead 130 is connected with each piezoresistive element 129 and the opposite end portion thereof is connected with an electrically conductive film 132 as explained later.

An insulator film 131 of an electrically insulating material such as silicon dioxide is deposited on the upper-side face of the surface layer 121B of the SOI substrate 121, as well as the insulator film 41 of the aforementioned second embodiment. The insulator film 131 is conformally deposited on the recess 126 to cover the piezoresistive elements 129 and the diffused leads 130. The insulator film 131 has contact holes 131A each positioned corresponding to the opposite end portion of the diffused lead 130.

The electrically conductive films 132 similar to the electrically conductive films 42 of the aforementioned second embodiment are deposited on predetermined regions of the upper-side face of the surface layer 121B through the insulator film 131. Each of the electrically conductive film 132 may be made of metal. The electrically conductive film 132 has one end portion connected with the diffused lead 130 through the contact hole 131A of the insulator film 131. The electrically conductive film 132 has the other end outside the diaphragm portion 125 which forms an electrode 132A connected to an external detecting circuit, not shown.

A protective film 133 of an electrically insulating material is conformally deposited overall on the upper-side face of the surface layer 121B of the SOI substrate 121. The protective film 133 is similar to the protective film 43 of the aforementioned second embodiment. The protective film 133 has contact holes 133A for electrical connection of the electrically conductive films 132 with the external detecting circuit.

The recess 126 is covered with the insulator film 131 and the protective film 133 which are extremely thinned and conformally deposited on the recess 126. An outer recessed surface 126A similar in shape to the recessed surface 126B is located on the protective film 133.

A lid 134 is fixedly mounted to the thicker portion 128 of the diaphragm portion 125 of the SOI substrate 121 via the insulator film 131 and the protective film 133, as well as the lid 44 of the aforementioned second embodiment. The lid 134 covers the recess 126 and the detector portion 129 within the recess 126. The lid 134 is made of such a rigid material as to reinforce the thicker portion 128. The lid 134 may be secured to the thicker portion 128 by anode coupling. The lid 134 and the diaphragm portion 125 cooperate to define a reference pressure chamber S between the outer recessed surface 126A of the recess 126 and a rearside surface of the lid 134 which is opposed to the recess 126.

The pressure sensor of the seventh embodiment is formed by the method similar to the method as explained in the second embodiment, except the following process. In the process of forming the recess 126, the surface layer 121B is anisotropically etched, for instance, using dry etching, to form a preform recess having a predetermined opening area and a predetermined depth. Subsequently, the surface layer 121B anisotropically etched is isotropically etched, for instance, using wet etching, to form the completed recess 126 with a round portion which is defined by the round beveled surface 126B3 having a desirable radius of curvature.

The pressure sensor of the seventh embodiment can exhibit substantially same function and effects as those of the pressure sensors of the aforementioned preceding embodiments. Further, by using isotropic etching after anisotropic etching, the radius of curvature of the round beveled surface 126B3 of the recessed surface 126B can be optimally determined without depending on the depth of the recess 126. The opening area and depth of the recess 126 can be readily determined. The recess 126 having a relatively small opening area can be formed, so that the pressure sensor having a reduced size may be fabricated.

Figure 47:
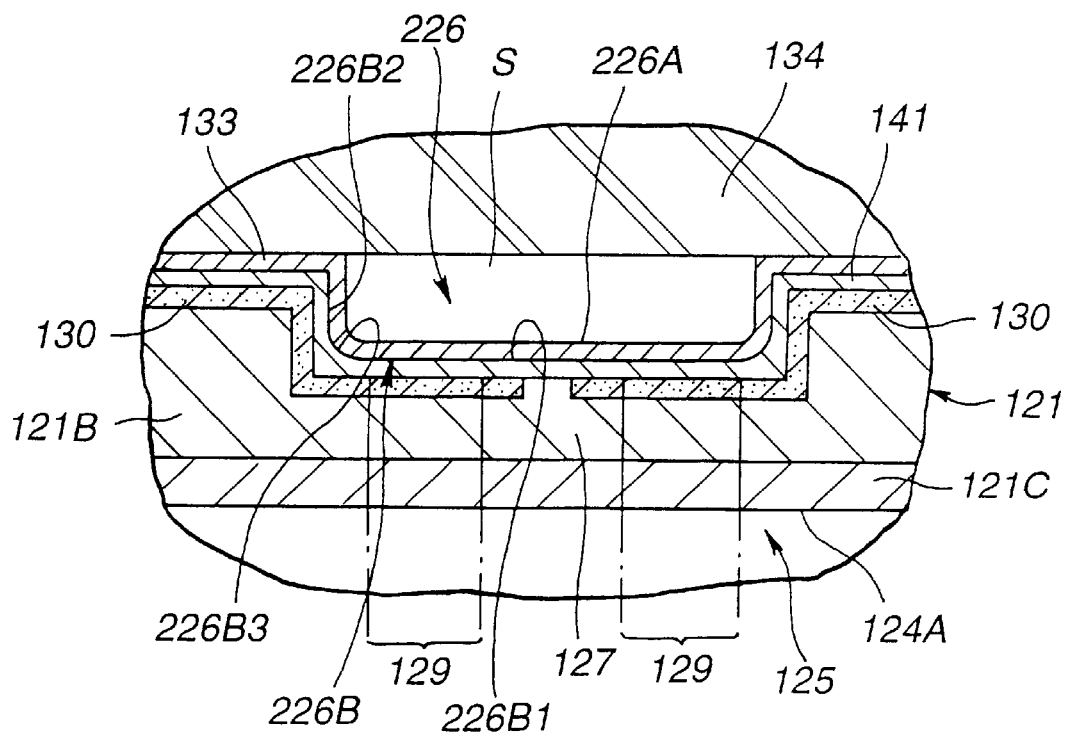
FIG. 47 is a modification of the seventh embodiment.

FIG. 47 illustrates a modification of the aforementioned seventh embodiment of the pressure sensor, which differs from the seventh embodiment in that the substrate includes a spin-on-glass (SOG) film deposited on the SOI substrate and a recessed surface is formed on the SOG film. Like reference numerals denote like parts and therefore detailed explanations therefor are omitted.

As shown in FIG. 47, the substrate of the pressure sensor includes the SOI substrate 121 and the SOG film 141 deposited on the surface layer 121B of the SOI substrate 121 by coating. A recess 226 is disposed within the diaphragm portion 125 and formed in the SOG film 141 of the substrate. The recess 226 is recessed inwardly from an upper-side face of the SOG film 141 and in the form of a generally rectangular-shaped groove similar to the recess 126 of the seventh embodiment. The recess 226 is defined by the recessed surface 226B which is formed on the SOG film 141. The recessed surface 226B is structurally substantially same as the recessed surface 126B of the seventh embodiment. The recessed surface 226B includes a planar rectangular-shaped bottom surface 226B1, a peripheral side surface 226B2 inclined relative to the bottom surface 226B1, and a round beveled surface 226B3 interposed between the bottom surface 226B1 and the side surface 226B2 to connect them. The bottom surface 226B1 has a smaller area than that of the bottom surface 124A of the recess 124. The round beveled surface 226B3 has an arcuate-shaped vertical section. The open end of the recess 226 may be formed with a round beveled surface similar to the round beveled surface 226B3.

The protective film 133 is conformally deposited overall on the SOG film 141 of the substrate. Thus, the recess 226 is covered with the protective film 133 so that an outer recessed surface 226A similar in shape to the recessed surface 226B is placed on the SOG film 141. The reference pressure chamber S is defined between the outer recessed surface 226A and the rearside surface of the lid 134 which is opposed to the recess 226.

The pressure sensor of this modification is formed by the method similar to the method as explained in the second embodiment, except the following processes. In the process of preparing the substrate, the surface layer 121B of the SOI substrate 121 is coated with the SOG film 141. Subsequently, in the process of forming the recess 226, the SOG film 141 is subjected to anisotropic etching to form a preform recess and then isotropic etching to form a completed recess 226 with a round portion which is defined by the round beveled surface 226B3.

The piezoresistive element is not limited to one formed by doping as explained in the aforementioned embodiments but it may be made of polycrystalline silicon, metal film, or the like.

The detector element of the pressure sensitive arrangement is not limited to the piezoresistive element and the capacitive element as explained in the aforementioned embodiments but it may be piezoelectric element.

An amorphous or polycrystalline silicon film may be deposited on the protective film and then the lid may be fixed to the amorphous or polycrystalline silicon film by anode coupling.

The configuration of the recess is not limited to the generally rectangular shape explained in the aforementioned embodiments but it may be other various shapes such as polygon, circle, ellipse.

What is claimed is:

1. A pressure sensor, comprising:
   a diaphragm portion;
   a substrate including said diaphragm portion, said substrate having one surface and an opposite surface and formed with a first recess recessed inwardly from said one surface to define said diaphragm portion between said first recess and said opposite surface;
   a second recess disposed within the diaphragm portion;
   a pressure sensitive arrangement having a detector portion disposed within the second recess; and
   a lid fixed to the diaphragm portion to cover the second recess and the detector portion of the pressure sensitive arrangement.

2. A pressure sensor as claimed in claim 1, wherein said diaphragm portion and said lid cooperate to define a reference pressure chamber between the second recess and a surface of the lid opposed to the second recess.

3. A pressure sensor as claimed in claim 1, wherein said second recess has a planar bottom surface smaller than a bottom surface of the first recess.

4. A pressure sensor as claimed in claim 3, wherein said second recess includes a plurality of recesses, a total area of which is smaller than an area of the bottom surface of the first recess.

5. A pressure sensor as claimed in claim 3, wherein said second recess is defined by a recessed surface including a round beveled surface connected with a periphery of the bottom surface.

6. A pressure sensor as claimed in claim 5, wherein said recessed surface of the second recess has a peripheral side surface inclined relative to the bottom surface.

7. A pressure sensor as claimed in claim 6, wherein said peripheral side surface includes a beveled portion connected with the bottom surface and a curved portion connected with the beveled portion, said beveled portion and said curved portion cooperating to form an arcuate-shaped vertical section.

8. A pressure sensor as claimed in claim 6, wherein said peripheral side surface includes a planar portion substantially perpendicular to the bottom surface.

9. A pressure sensor as claimed in claim 5, wherein said recessed surface of the second recess includes a second round beveled surface disposed at an open end of the second recess.

10. A pressure sensor as claimed in claim 5, wherein said second recess has a generally rectangular shape and the round beveled surface at each corner thereof.

11. A pressure sensor as claimed in claim 10, wherein said recessed surface has a peripheral side surface including a planar portion interposed between the adjacent two of the round beveled surfaces.

12. A pressure sensor as claimed in claim 11, further comprising a film of spin-on-glass (SOG) deposited on the substrate, said SOG film being formed with the round beveled surface and the peripheral side surface connected with the round beveled surface.

13. A pressure sensor as claimed in claim 11, wherein said periphery of the bottom surface is a rectilinear periphery and the peripheral side surface includes a side surface portion having a length twice or more a length of the detector portion coextending with the side surface portion.

14. A pressure sensor as claimed in claim 10, wherein said round beveled surface has a radius of curvature of approximately 8–30% of a length of a line segment constituting the generally rectangular shape.

15. A pressure sensor as claimed in claim 1, wherein said diaphragm portion includes a thinned portion defined between the second recess and the one surface of said substrate, and a thicker portion surrounding the thinned portion.

16. A pressure sensor as claimed in claim 15, wherein said lid has a predetermined rigidity to reinforce the thicker portion of the diaphragm portion.

17. A pressure sensor as claimed in claim 15, wherein said thicker portion of the diaphragm portion has a width of at least not less than 10 $\mu$m.

18. A pressure sensor as claimed in claim 1, wherein said pressure sensitive arrangement includes an electrically conductive film and diffused leads connecting the detector portion with the electrically conductive film.

19. A pressure sensor as claimed in claim 1, wherein said detector portion includes a piezoresistive element.

20. A pressure sensor as claimed in claim 1, wherein said detector portion includes a capacitive element comprising a first electrode disposed on a bottom surface of the second recess and a second electrode disposed on a surface of the lid in opposed relation to the first electrode.

21. A method for forming a pressure sensor according to claim 1, comprising the steps of:
   a) preparing a substrate having opposed surfaces;
   b) forming a first recess recessed inwardly from one of the opposed surfaces of the substrate to define a diaphragm portion between the first recess and the other of the opposed surfaces;
   c) forming a second recess within the diaphragm portion;
   d) placing a detector portion, forming a part of a pressure sensitive arrangement, within the second recess;
   e) fixing a lid to the substrate to define a reference pressure chamber between the second recess and a surface of the lid opposed to the second recess.

22. A method as claimed in claim 21, further comprising the step of placing other parts of the pressure sensitive arrangement in the substrate, the step of placing other parts of the pressure sensitive arrangement comprising:
   placing diffused leads connected with the detector portion, in the substrate; and
   depositing an electrically conductive film connected with the diffused leads, on the substrate.

23. A method as claimed in claim 22, wherein the step of preparing a substrate comprises growing one layer of a first conductivity type onto a silicon base of a second conductivity type.

24. A method as claimed in claim 23, wherein the step of growing one layer onto a silicon base comprises in the following sequence:
   providing the silicon base having opposed surfaces;
   depositing a film of silicon dioxide on the opposed surfaces of the silicon base and a film of silicon nitride on the silicon dioxide film;
   selectively removing the silicon nitride film on one of the opposed surfaces of the silicon base to partially expose the silicon base thereunderneath;
   oxidizing the exposed portion of the silicon base by local oxidation of silicon (LOCOS);
   removing the remainder of the silicon nitride film on the one of the opposed surfaces of the silicon base to expose the silicon dioxide film thereunderneath; and
   selectively doping impurity into the silicon base underlying the exposed portion of the silicon dioxide film, to deposit the one layer on the silicon base.

25. A method as claimed in claim 24, wherein the step of forming a second recess comprises in the following sequence:
   selectively removing the silicon dioxide film overlying the one layer to partially expose the one layer thereunderneath;
   removing the exposed portion of the one layer to form the second recess recessed inwardly from one face of the one layer; and
   removing the remainder portion of the silicon dioxide film on the one layer.

26. A method as claimed in claim 24, wherein the step of forming a first recess comprises in the following sequence:
   selectively removing the silicon nitride film and the silicon dioxide film on the other of the opposed surfaces of the silicon base to partially expose the silicon base thereunderneath;

anisotropically etching the exposed portion of the silicon base over an area greater than an area of the first recess; and stopping the removal of the silicon base at an interface between the silicon base and the one layer.

27. A method as claimed in claim 23, wherein the step of placing a detector portion comprises doping impurity into a portion of the one layer which defines the second recess, to form a piezoresistive element within the second recess.

28. A method as claimed in claim 23, wherein the step of placing other parts of the pressure sensitive arrangement comprises:

depositing an insulator film of electrically insulating material on the silicon base and the one layer; and forming contact holes for connection of the detector portion and the electrically conductive film, in the insulator film.

29. A method as claimed in claim 28, wherein the step of placing other parts of the pressure sensitive arrangement comprises:

depositing a protective film of electrically insulating material on the electrically conductive film; and forming contact holes to define bonding pad regions on the electrically conductive film, in the protective film.

30. A method as claimed in claim 21, wherein the step of preparing a substrate comprises:

providing a silicon-on-insulator (SOI) substrate including a base of single crystal silicon, an insulator film of electrically insulating material on the base, and one layer of silicon based material on the insulator film; and depositing a film of silicon dioxide on opposed surfaces of the SOI substrate, and a film of silicon nitride on the silicon dioxide film.

31. A method as claimed in claim 30, wherein the step of providing the SOI substrate comprises doping impurity into the one layer of the SOI substrate.

32. A method as claimed in claim 30, wherein the step of forming a second recess comprises in the following sequence:

selectively removing the silicon nitride film on the silicon dioxide film on the one layer to partially expose the silicon dioxide film thereunderneath;

locally oxidizing the one layer underneath the exposed portion of the silicon dioxide film;

removing the remainder of the silicon nitride film on the silicon dioxide film on the one layer to expose the silicon dioxide film thereunderneath;

selectively removing the exposed silicon dioxide film on the one layer to partially expose the one layer thereunderneath;

removing the exposed portion of the one layer to form the second recess recessed inwardly from the one of the opposed surfaces of the SOI substrate; and removing the entire remainder of the silicon dioxide film on the one layer.

33. A method as claimed in claim 30, wherein the step of forming a second recess comprises in the following sequence:

selectively removing the silicon nitride film on the silicon dioxide film on the one layer to partially expose the silicon dioxide film thereunderneath;

locally oxidizing the one layer underneath the exposed portion of the silicon dioxide film;

removing the remainder of the silicon nitride film on the silicon dioxide film on the one layer.

34. A method as claimed in claim 30, wherein the step of forming a first recess comprises:

selectively removing the silicon nitride film and the silicon dioxide film deposited on the base, respectively, to partially expose the base thereunderneath;

anisotropically etching the exposed portion of the base over an area greater than an area of the second recess; and stopping the anisotropic etching at an interface between the base and the insulator film.

35. A method as claimed in claim 30, wherein the step of preparing a substrate comprises depositing an insulator film of electrically insulating material on the one of the opposed surfaces of the SOI substrate and a film of phosphosilicate glass (PSG) on the insulator film.

36. A method as claimed in claim 35, wherein the step of forming a second recess comprises selectively removing the PSG film by isotropic etching to form a curved portion of the recess which has a predetermined radius of curvature.

37. A method as claimed in claim 30, wherein the step of forming a second recess comprises selectively removing the one layer using anisotropic etching and isotropic etching after the anisotropic etching to form a second recess-defining surface including a planar bottom surface, a planar side surface substantially perpendicular to the bottom surface, and a round beveled surface interconnecting the bottom surface and the side surface.

38. A method as claimed in claim 30, wherein the step of preparing a substrate comprises depositing a film of spin-on-glass (SOG) on the one layer of the SOI substrate.

39. A method as claimed in claim 38, wherein the step of forming a second recess comprises selectively removing the SOG film using anisotropic etching and isotropic etching to form a second recess-defining surface including a planar bottom surface, a planar side surface inclined relative to the bottom surface, and a round beveled surface interconnecting the bottom surface and the side surface.

40. A method as claimed in claim 21, wherein the step of placing a detector portion comprises:

doping impurity into a portion of the substrate which defines the first recess, to form a first electrode within the second recess; and prior to the step of fixing the lid to the substrate, depositing a film of electrically conductive material on the surface of the lid opposed to the second recess, to form a second electrode cooperating with the first electrode to form a capacitive element as the detector portion.

41. A pressure sensor as claimed in claim 1, wherein said substrate includes a base and one layer on the base, said base being formed with the first recess, said one layer including the diaphragm portion.

42. A pressure sensor as claimed in claim 41, wherein said one layer is electrically isolated from the base.

43. A pressure sensor as claimed in claim 41, wherein each of the base and the one layer is made of silicon based material.

44. A pressure sensor as claimed in claim 43, wherein the substrate is a silicon-on-insulator (SOI) substrate and said substrate further includes a film of electrically insulating material interposed between the base and the one layer.

45. A pressure sensor as claimed in claim 44, wherein the substrate further includes a film of phosphosilicate glass (PSG) deposited on the SOI substrate, said second recess being formed in the PSG film.

46. A pressure sensor formed by a method comprising the steps of:
- a) preparing a substrate having opposed surfaces;
- b) forming a first recess recessed inwardly from one of the opposed surfaces of the substrate to form a diaphragm portion between the first recess and the other of the opposed surfaces;
- c) forming a second recess within the diaphragm portion;
- d) placing a detector portion, forming a part of a pressure sensitive arrangement, within the second recess;
- e) placing other parts of the pressure sensitive arrangement in the substrate, comprising:
  placing diffused leads connected with the detector portion, in the substrate; and
  depositing an electrically conductive film connected with the diffused leads, on the substrate; and
- f) fixing a lid to the diaphragm portion to define a reference pressure chamber between the second recess and a surface of the lid opposed to the second recess.

* * * * *